US010510723B2

(12) United States Patent
Lu et al.

(10) Patent No.: US 10,510,723 B2
(45) Date of Patent: Dec. 17, 2019

(54) BUFFER LAYER(S) ON A STACKED STRUCTURE HAVING A VIA

(71) Applicant: Taiwan Semiconductor Manufacturing Company, Ltd., Hsinchu (TW)

(72) Inventors: Chen-Fa Lu, Kaohsiung (TW); Cheng-Yuan Tsai, Chu-Pei (TW); Yeur-Luen Tu, Taichung (TW); Chia-Shiung Tsai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/784,965

(22) Filed: Oct. 16, 2017

(65) Prior Publication Data

US 2018/0053748 A1 Feb. 22, 2018

Related U.S. Application Data

(62) Division of application No. 14/459,144, filed on Aug. 13, 2014, now Pat. No. 9,793,243.

(51) Int. Cl.
*H01L 21/44* (2006.01)
*H01L 25/065* (2006.01)
(Continued)

(52) U.S. Cl.
CPC .... *H01L 25/0657* (2013.01); *H01L 21/76877* (2013.01); *H01L 21/76898* (2013.01);
(Continued)

(58) Field of Classification Search
CPC ..... H01L 2224/0239; H01L 2224/0401; H01L 2224/05572; H01L 2224/94;
(Continued)

(56) References Cited

U.S. PATENT DOCUMENTS 5,851,911 A * 12/1998 Farnworth .............. H01L 24/11
438/614
6,444,295 B1 * 9/2002 Peng ....................... H01L 24/03
257/774
(Continued)

FOREIGN PATENT DOCUMENTS

CN  1669123 A  9/2005
CN  1941344 A  4/2007
(Continued)

*Primary Examiner* — Bradley Smith
*Assistant Examiner* — David J Goodwin
(74) *Attorney, Agent, or Firm* — Slater Matsil, LLP

(57) ABSTRACT

A structure includes first and second substrates, first and second stress buffer layers, and a post-passivation interconnect (PPI) structure. The first and second substrates include first and second semiconductor substrates and first and second interconnect structures on the first and second semiconductor substrates, respectively. The second interconnect structure is on a first side of the second semiconductor substrate. The first substrate is bonded to the second substrate at a bonding interface. A via extends at least through the second semiconductor substrate into the second interconnect structure. The first stress buffer layer is on a second side of the second semiconductor substrate opposite from the first side of the second semiconductor substrate. The PPI structure is on the first stress buffer layer and is electrically coupled to the via. The second stress buffer layer is on the PPI structure and the first stress buffer layer.

20 Claims, 25 Drawing Sheets

(51) Int. Cl.
  *H01L 23/48* (2006.01)
  *H01L 27/06* (2006.01)
  *H01L 21/822* (2006.01)
  *H01L 23/29* (2006.01)
  *H01L 23/00* (2006.01)
  *H01L 23/31* (2006.01)
  *H01L 21/768* (2006.01)
  *H01L 23/522* (2006.01)
  *H01L 23/528* (2006.01)
  *H01L 25/00* (2006.01)

(52) U.S. Cl.
  CPC ........ *H01L 21/8221* (2013.01); *H01L 23/293* (2013.01); *H01L 23/3192* (2013.01); *H01L 23/481* (2013.01); *H01L 23/528* (2013.01); *H01L 23/5226* (2013.01); *H01L 23/562* (2013.01); *H01L 24/05* (2013.01); *H01L 24/09* (2013.01); *H01L 24/13* (2013.01); *H01L 24/89* (2013.01); *H01L 25/50* (2013.01); *H01L 27/0688* (2013.01); *H01L 21/76805* (2013.01); *H01L 23/3114* (2013.01); *H01L 24/03* (2013.01); *H01L 24/08* (2013.01); *H01L 24/80* (2013.01); *H01L 2224/023* (2013.01); *H01L 2224/024* (2013.01); *H01L 2224/02351* (2013.01); *H01L 2224/0345* (2013.01); *H01L 2224/0401* (2013.01); *H01L 2224/05008* (2013.01); *H01L 2224/05024* (2013.01); *H01L 2224/05025* (2013.01); *H01L 2224/0558* (2013.01); *H01L 2224/05124* (2013.01); *H01L 2224/05147* (2013.01); *H01L 2224/05155* (2013.01); *H01L 2224/05166* (2013.01); *H01L 2224/05572* (2013.01); *H01L 2224/05644* (2013.01); *H01L 2224/05647* (2013.01); *H01L 2224/08145* (2013.01); *H01L 2224/08146* (2013.01); *H01L 2224/1132* (2013.01); *H01L 2224/1145* (2013.01); *H01L 2224/11462* (2013.01); *H01L 2224/11849* (2013.01); *H01L 2224/12105* (2013.01); *H01L 2224/13024* (2013.01); *H01L 2224/13111* (2013.01); *H01L 2224/13139* (2013.01); *H01L 2224/13147* (2013.01); *H01L 2224/80895* (2013.01); *H01L 2224/80896* (2013.01); *H01L 2224/80986* (2013.01); *H01L 2224/9202* (2013.01); *H01L 2224/9212* (2013.01); *H01L 2225/06527* (2013.01); *H01L 2225/06541* (2013.01); *H01L 2225/06548* (2013.01)

(58) Field of Classification Search
  CPC ..... H01L 21/76898; H01L 2224/13022; H01L 24/16; H01L 2225/06517
  See application file for complete search history.

(56) References Cited

U.S. PATENT DOCUMENTS

| | | | |
|---|---|---|---|
| 6,455,408 B1* | 9/2002 | Hwang | H01L 23/3114 257/E21.508 |
| 7,429,795 B2 | 9/2008 | Su et al. | |
| 7,977,789 B2 | 7/2011 | Park | |
| 7,994,045 B1* | 8/2011 | Huemoeller | H01L 24/11 438/612 |
| 8,563,403 B1* | 10/2013 | Farooq | H01L 21/8221 257/E21.597 |
| 2002/0050634 A1 | 5/2002 | Han | |
| 2002/0197458 A1 | 12/2002 | Peng et al. | |
| 2004/0029586 A1 | 2/2004 | Laroia et al. | |
| 2006/0118867 A1 | 6/2006 | Tempel | |
| 2006/0269005 A1 | 11/2006 | Laroia et al. | |
| 2007/0090402 A1 | 4/2007 | Su et al. | |
| 2007/0117348 A1 | 5/2007 | Ramanathan et al. | |
| 2007/0216041 A1 | 9/2007 | Patti et al. | |
| 2010/0140752 A1* | 6/2010 | Marimuthu | H01L 23/3121 257/621 |
| 2011/0147922 A1 | 6/2011 | Bezama et al. | |
| 2011/0171827 A1 | 7/2011 | Farooq et al. | |
| 2011/0193197 A1* | 8/2011 | Farooq | H01L 21/76898 257/618 |
| 2011/0205994 A1 | 8/2011 | Han et al. | |
| 2012/0248544 A1 | 10/2012 | Yokoyama | |
| 2013/0181338 A1 | 7/2013 | Lu et al. | |
| 2014/0362804 A1 | 12/2014 | Han et al. | |

FOREIGN PATENT DOCUMENTS

| | | |
|---|---|---|
| JP | 2008533820 A | 8/2008 |
| JP | 2012506662 A | 3/2012 |
| JP | 2012216776 A | 11/2012 |
| KR | 20020010813 A | 2/2002 |
| KR | 1020110114155 A | 10/2011 |
| WO | 2013064835 A2 | 5/2013 |
| WO | 2014075637 A1 | 5/2014 |
| WO | 2014090189 A1 | 6/2014 |

* cited by examiner

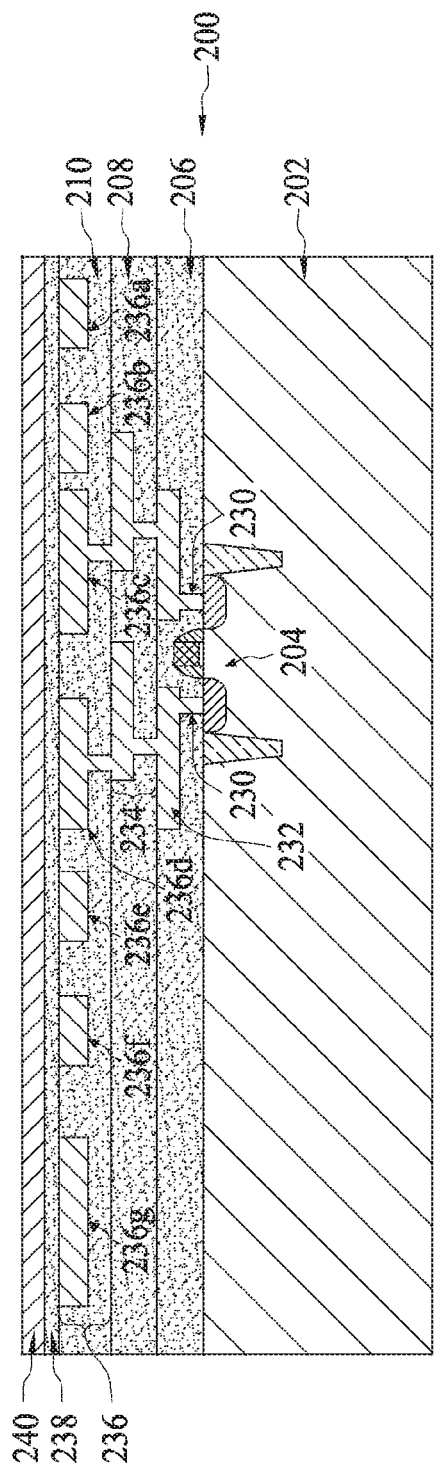
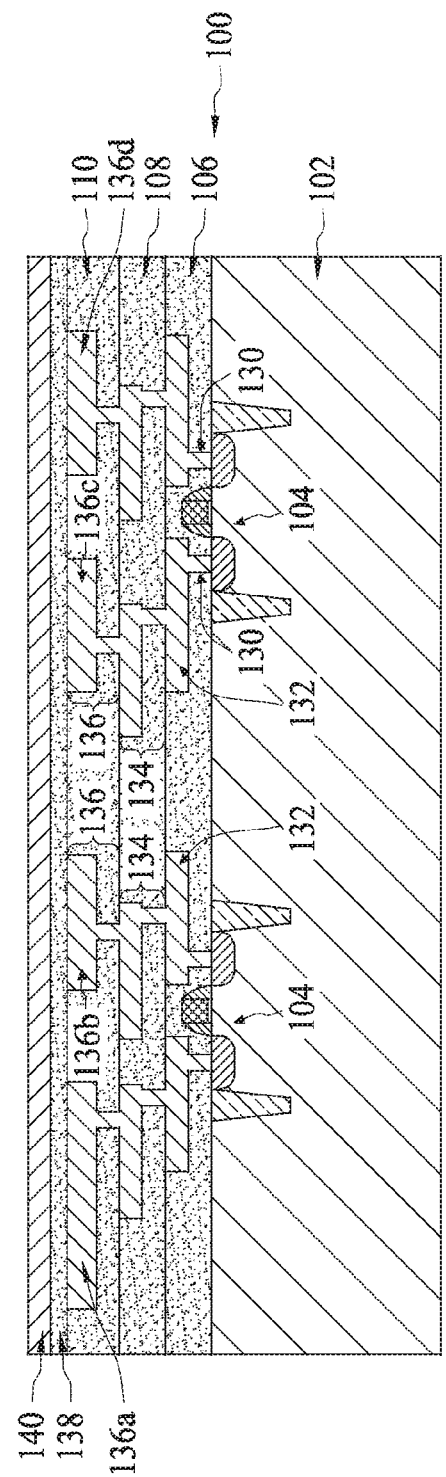
FIG. 1B
FIG. 1A

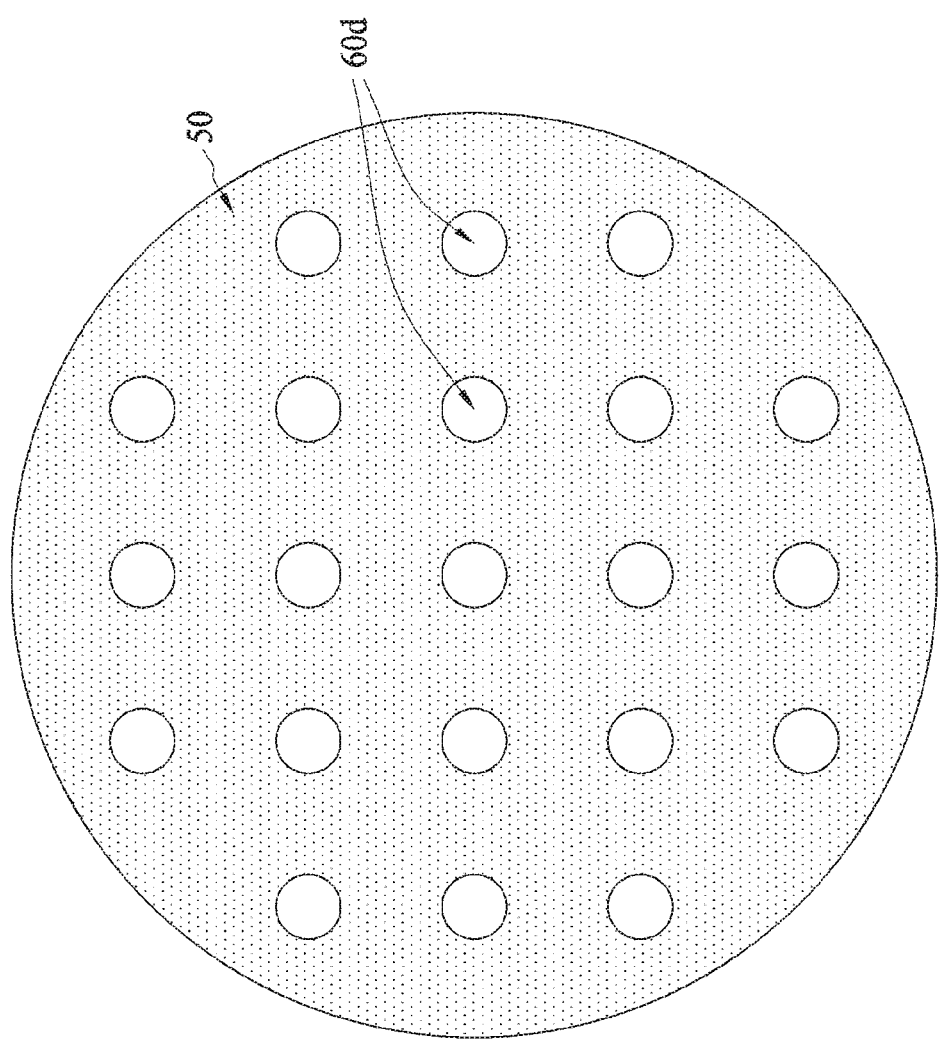

BUFFER LAYER(S) ON A STACKED STRUCTURE HAVING A VIA

CROSS-REFERENCE TO RELATED APPLICATIONS

This application is a divisional of U.S. patent application Ser. No. 14/459,144, filed on Aug. 13, 2014, which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers may be bonded together through suitable bonding techniques. An electrical connection may be provided between the stacked semiconductor wafers. The stacked semiconductor devices may provide a higher density with smaller form factors and allow for increased performance and lower power consumption.

An advantage of a preferred embodiment of the present invention is

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, and 2-8 are various cross-sectional views of structures in intermediate steps of forming a bonded structure in accordance with some embodiments.

FIGS. 10A, 10B, 10C, 10D, and 10E are example layout views of a portion of a post-passivation interconnect (PPI) with openings therethrough in accordance with some embodiments.

DETAILED DESCRIPTION OF ILLUSTRATIVE EMBODIMENTS

Figure 2:
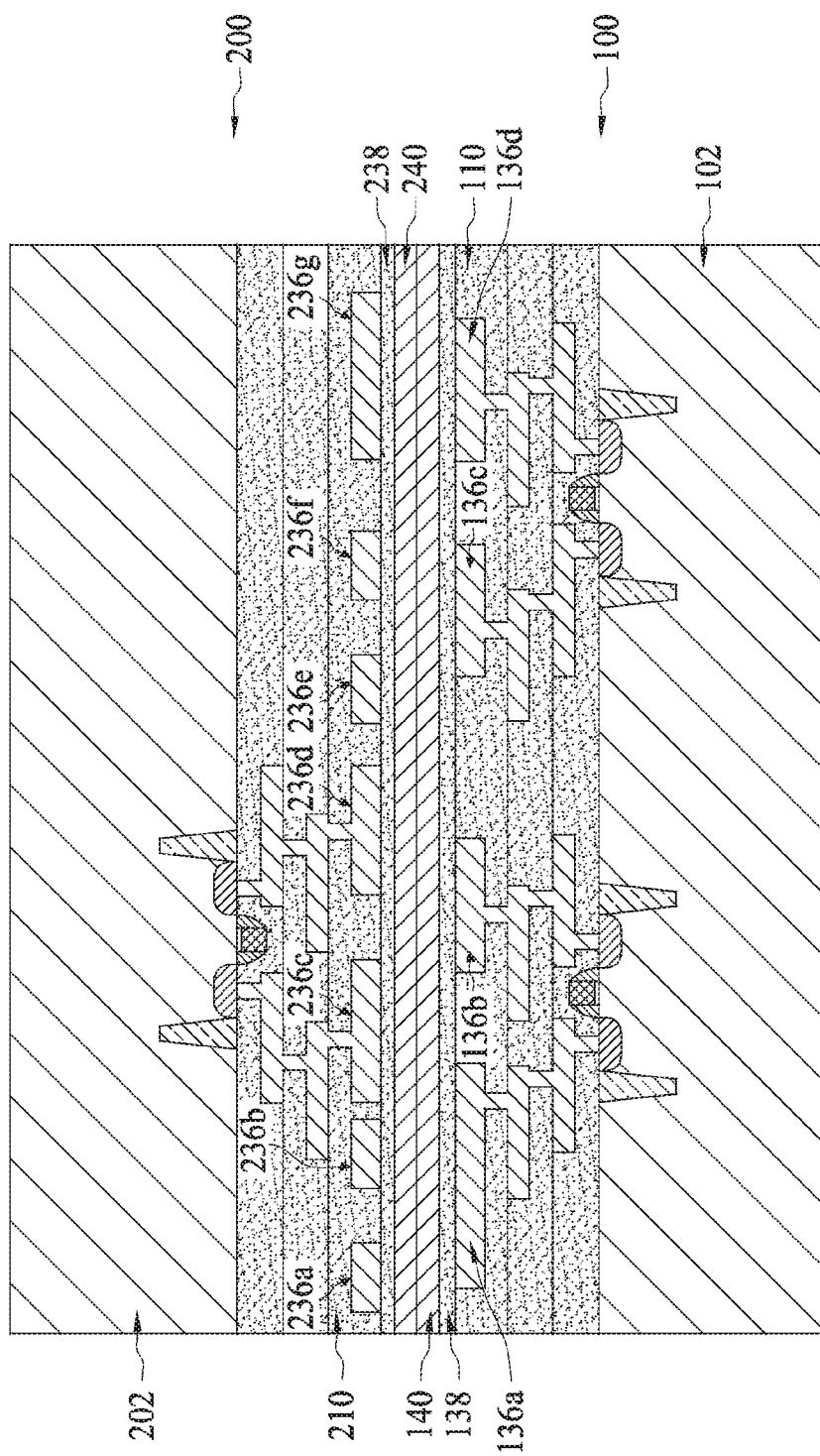

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, some method embodiments discussed herein are discussed as being performed in a particular order; however, other method embodiment contemplate performance in any logical order.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein are in the context of stacked and/or bonded structures, and more particularly, stacked and/or bonded structures having a via extending at least through a semiconductor substrate. One of ordinary skill in the art will readily understand various modifications that may be made to the embodiments discussed herein, which modifications are also contemplated by other embodiments.

FIGS. 1A, 1B, and 2-8 illustrate various cross-sectional views of structures in intermediate steps of forming a bonded structure in accordance with an embodiment. Referring first to FIGS. 1A and 1B, a first substrate 100 and a second substrate 200 are shown prior to a bonding process in accordance with various embodiments. In an embodiment, the second substrate 200 has similar features as the first substrate 100, and for simplicity of the following discussion, the features of the second substrate 200 having reference numerals of the form "2xx" are similar to features of the first substrate 100 having reference numerals of the form "1xx," the "xx" being the same numerals for the first substrate 100 and the second substrate 200. The various elements of the first substrate 100 and the second substrate 200 will be referred to as the "first <element> 1xx" and the "second <element> 2xx," respectively.

In an embodiment, the first substrate 100 comprises a first semiconductor substrate 102 having a first electrical circuit (illustrated by first electrical circuitry including first transistors 104) formed thereon. The first semiconductor substrate 102 may comprise, for example, a bulk semiconductor, a semiconductor-on-insulator (SOI) substrate, or the like, which may be doped or undoped. The first semiconductor substrate 102 may be a wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the first semiconductor substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The first electrical circuitry formed on the first semiconductor substrate 102 may be any type of circuitry suitable for a particular application. In an embodiment, the circuitry includes electrical devices formed on the first semiconductor substrate 102 with one or more dielectric layers with metallization patterns overlying the electrical devices. The metallization patterns in the dielectric layers may route electrical signals between the electrical devices and/or to nodes external to the first substrate 100. Electrical devices may also be formed in one or more dielectric layers.

For example, the first electrical circuitry may include various devices, such as transistors, capacitors, resistors, diodes, photo-diodes, fuses, and the like, interconnected to perform one or more functions. The first electrical circuitry may include memory structures, processing structures, sensors, amplifiers, power distribution, input/output circuitry, or the like. An example illustrated in the figures shows first transistors 104 in the first substrate 100. Each first transistor 104 comprises source/drain regions in an active region of the first semiconductor substrate 102, where the active regions are defined by isolation regions, such as shallow trench isolations (STIs), in the first semiconductor substrate 102. Each first transistor 104 further comprises a gate structure on the first semiconductor substrate 102 disposed between respective source/drain regions. The gate structure comprises a gate dielectric on the first semiconductor substrate 102, a gate electrode on the gate dielectric, and gate spacers on opposing lateral sides of the gate dielectric and gate electrode. One of ordinary skill in the art will appreciate that the above examples are provided for illustrative purposes. Other circuitry may be used as appropriate for a given application.

Also shown in FIG. 1 are first inter-layer dielectric (ILD) layer 106 and first inter-metallization dielectric (IMD) layers 108 and 110. The first ILD layer 106 and first IMD layers 108 and 110 may be formed, for example, of a low-K dielectric material, such as phosphosilicate glass (PSG), borophosphosilicate glass (BPSG), FSG, SiOxCy, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the first ILD layer 106 and first IMD layers 108 and 110 may comprise any number of dielectric layers.

First contacts 130 are formed through the first ILD layer 106 to provide an electrical contact to the first transistors 104, such as to the source/drain regions of the first transistors 104. The first contacts 130 may be formed, for example, by using photolithography techniques to deposit and pattern a photoresist material on the first ILD layer 106 to expose portions of the first ILD layer 106 that are to become the first contacts 130. An etch process, such as an anisotropic dry etch process, may be used to create openings in the first ILD layer 106. The openings may be lined with a diffusion barrier layer and/or an adhesion layer (not shown), and filled with a conductive material. The diffusion barrier layer may comprise one or more layers of TaN, Ta, TiN, Ti, CoW, or the like, and the conductive material may comprise copper, tungsten, aluminum, silver, and combinations thereof, or the like, thereby forming the first contacts 130 as illustrated in FIGS. 1A and 1B.

Similarly, first metallization patterns 132, 134, and 136, which may include vias to underlying metallization patterns, are formed in the first ILD layer 106 and the first IMD layers 108 and 110, respectively. The first metallization patterns 132, 134, and 136 may be formed, for example, by using photolithography techniques to deposit and pattern a photoresist material on the respective first ILD layer 106 and first IMD layers 108 and 110 to expose portions of the first ILD layer 106 or first IMD layer 108 or 110 that are to become the respective first metallization pattern 132, 134, or 136. An etch process, such as an anisotropic dry etch process, may be used to create recesses/openings in the first ILD layer 106 or first IMD layer 108 or 110. The recesses/openings may be lined with a diffusion barrier layer and/or an adhesion layer (not shown), and filled with a conductive material. The diffusion barrier layer may comprise one or more layers of TaN, Ta, TiN, Ti, CoW, or the like, and the conductive material may comprise copper, tungsten, aluminum, silver, and combinations thereof, or the like, thereby forming the first metallization patterns 132, 134, and 136 as illustrated in FIGS. 1A and 1B. Generally, the first ILD layer 106 and first IMD layers 108 and 110 and the associated first metallization patterns 132, 134, and 136 are used to interconnect the electrical circuitry and to provide an external electrical connection.

For ease of discussion herein, first interconnect lines/pads 136a, 136b, 136c, and 136d of the first metallization pattern 136 in the first IMD layer 110 in the first substrate 100 and second interconnect lines/pads 236a, 236b, 236c, 236d, 236e, 236f, and 236g in the second metallization pattern 236 in the second IMD layer 210 in the second substrate 200 are labeled.

It should also be noted that one or more etch stop layers (not shown) may be positioned between adjacent ones of the ILD and IMD layers, e.g., the first ILD layer 106 and the first IMD layers 108 and 110. Generally, the etch stop layers provide a mechanism to stop an etching process when forming vias and/or contacts. The etch stop layers are formed of a dielectric material having a different etch selectivity from adjacent layers, e.g., an etch stop layer between the underlying first semiconductor substrate 102 and the overlying first ILD layer 106. In an embodiment, etch stop layers may be formed of SiN, SiCN, SiCO, CN, combinations thereof, or the like, deposited by CVD or PECVD techniques.

In the illustrated embodiment, a first additional dielectric layer 138 is formed over the first IMD layer 110. The first additional dielectric layer 138 may be formed, for example, of a low-K dielectric material, such as PSG, BPSG, FSG, SiOxCy, Spin-On-Glass, Spin-On-Polymers, silicon carbon material, compounds thereof, composites thereof, combinations thereof, or the like, by any suitable method known in the art, such as spinning, CVD, and PECVD. A first bonding dielectric layer 140 is formed over the first additional dielectric layer 138. The first bonding dielectric layer 140 may be any dielectric layer that allows for bonding between substrates; for example, the first bonding dielectric layer 140 may be an oxide, silicon oxynitride (SiON), or the like formed by thermal oxidation, CVD, or the like.

With reference to FIG. 2, the first substrate 100 and the second substrate 200 are arranged with the device sides of the first semiconductor substrate 102 and the second semiconductor substrate 202 facing each other and are bonded, e.g., bonded by bonding the additional dielectric layers 138 together. In the illustrated embodiment, the first substrate 100 and the second substrate 200 are bonded together using a direct bonding process such as dielectric-to-dielectric bonding (e.g., oxide-to-oxide bonding). Other embodiments contemplate other bonding processes, such as metal-to-metal bonding (e.g., copper-to-copper bonding), metal-to-dielectric bonding (e.g., oxide-to-copper bonding), any combinations thereof, and/or the like.

It should be noted that the bonding may be at wafer level, where the first substrate 100 and the second substrate 200 are bonded together and are then singulated into separated dies. In other embodiments, the bonding may be performed at the die-to-die level, or the die-to-wafer level.

Figure 3:
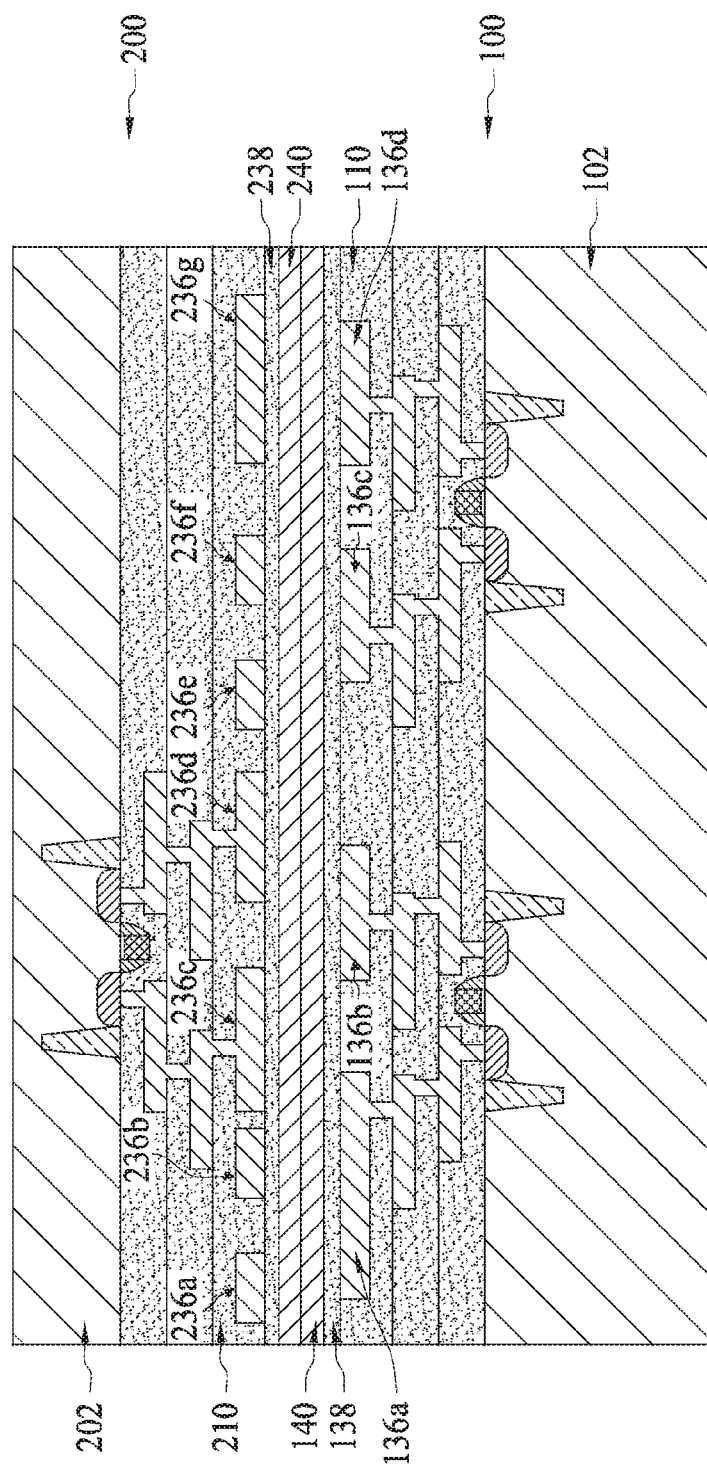

With reference to FIG. 3, after the first substrate 100 and the second substrate 200 are bonded, a thinning process may be applied to the backside of the second substrate 200, e.g., to the backside of the second semiconductor substrate 202. In an embodiment, the backside of the second substrate 200 may be thinned by using suitable techniques such as grinding, polishing, a SMARTCUT® procedure, an ELTRAN® procedure, and/or chemical etching. For example, before thinning, each of the first semiconductor substrate 102 and the second semiconductor substrate 202 may have a thickness between about 100 µm and 775 µm, and after thinning, the second semiconductor substrate 202 may have a thickness between about 2 µm and 3 µm.

Figure 4:
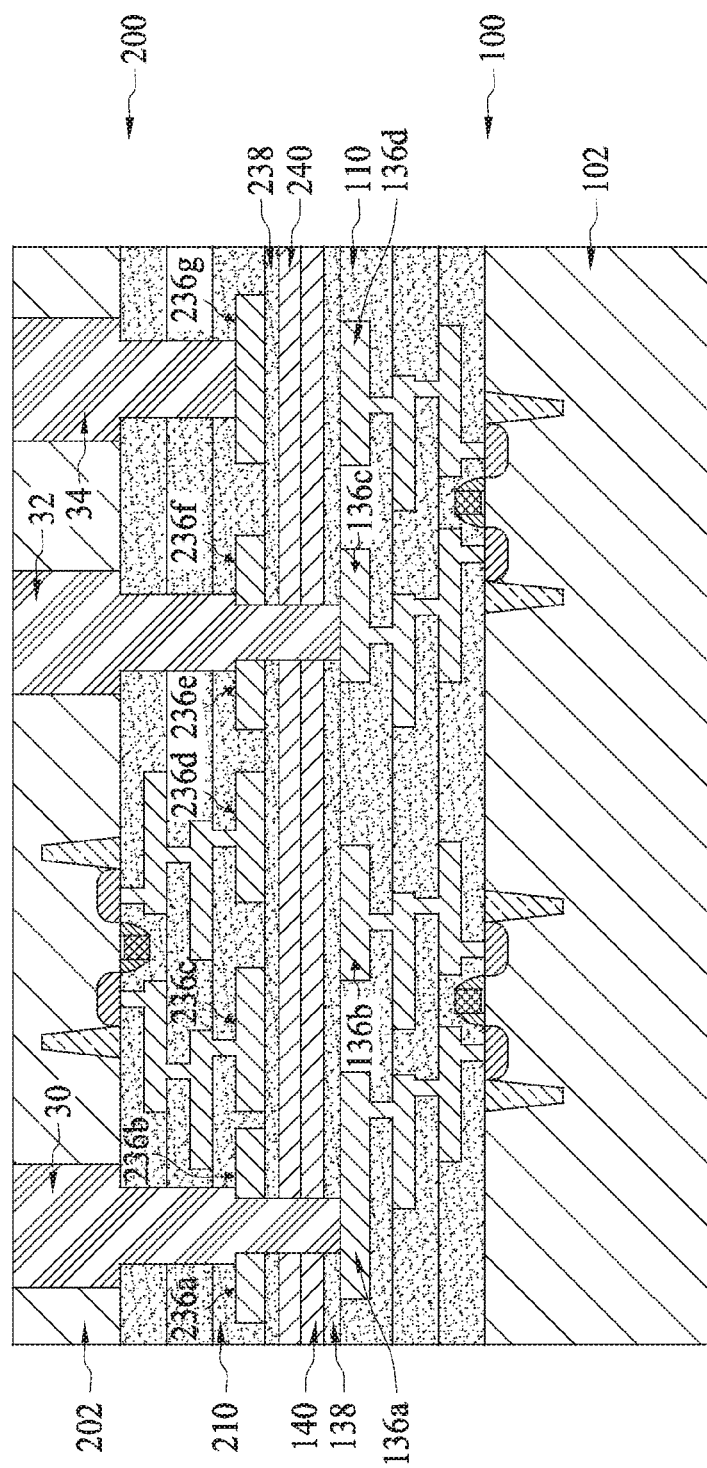

With reference to FIG. 4, through vias 30, 32, and 34 are formed. As discussed in greater detail below, an electrical connection is formed extending from a backside of the second substrate 200 to select ones of the first interconnect lines/pads 136a and 136c of the first substrate 100 and/or to select ones of the second interconnect lines/pads 236g.

First, openings are formed for the vias 30, 32, and 34 through the second semiconductor substrate 202. The openings may be formed using photolithography techniques, for example, to deposit and pattern a photoresist material on the second semiconductor substrate 202 to expose the second semiconductor substrate 202 where the openings will be formed. An etch process, such as an anisotropic dry etch process, may be used to create the openings in the second semiconductor substrate 202. Various layers may be present on the second semiconductor substrate 202 during these processes, such as hardmask layer(s), anti-reflection coating (ARC) layer(s), the like, or a combination thereof.

One or more dielectric film(s) can be formed over the backside of the second semiconductor substrate 202 and along sidewalls of the openings in the second semiconductor substrate 202. A dielectric film(s) can provide passivation and isolation between through vias and device circuits and can provide protection to the second semiconductor substrate 202 during, for example, a subsequent etch process. Further, a dielectric film(s) may provide protection against metal ions diffusing into the second semiconductor substrate 202.

In an embodiment, a multi-layered dielectric film is formed along the backside of the second semiconductor substrate 202 and in the openings. The multi-layered dielectric film comprises a first dielectric film and a second dielectric film over the first dielectric film. The materials of the first dielectric film and the second dielectric film are selected such that there is a relatively high etch selectivity between the two layers. An example of dielectric materials that may be used is a nitride material for the first dielectric film and an oxide for the second dielectric film. The nitride layer, such as a silicon nitride ($Si_3N_4$) layer, may be formed using CVD techniques. The oxide layer, such as a silicon dioxide layer, may be formed by thermal oxidation or by CVD techniques. Other materials, including other oxides, other nitrides, SiON, SiC, low k dielectric materials (e.g., Black Diamond), and/or high k oxides (e.g., $HfO_2$, $Ta_2O_5$) may be used. Spacer-shaped structures are formed from the second dielectric film using, for example, a dry etch process such that the second dielectric film is etched while causing little or no damage to the first dielectric film.

A patterned mask is formed over the backside of the second semiconductor substrate 202, which may be, for example, a photoresist material that has been deposited, masked, exposed, and developed as part of a photolithography process. The patterned mask is patterned to define via openings extending through the respective openings through the second semiconductor substrate 202 and through the second dielectric layers 206, 208, 210, 238, and 240 of the second substrate 200 and at least some of the first dielectric layers 140 and 138 of the first substrate 100, thereby exposing portions of select ones of the first interconnect lines/pads 136a and 136c and the second interconnect lines/pads 236g, as explained in greater detail below. One or more etching processes are performed to form these via openings. A suitable etching process, such as a dry etch, an anisotropic wet etch, or any other suitable anisotropic etch or patterning process, may be performed to form the via openings.

As can be seen by FIG. 4, the via opening for via 30 extends to the second interconnect lines/pads 236a and 236b and to the first interconnect line/pad 136a. The via opening for via 32 extends to the second interconnect lines/pads 236e and 236f and to the first interconnect line/pad 136c. The via opening for via 34 extends to the second interconnect line/pad 236g. In an embodiment, the first and second interconnect lines/pads are formed of a suitable metal material, such as copper, which exhibits a different etching rate (selectivity) than the dielectric layers 206, 208, 210, 238, 240, 140, and 138. As such, the second interconnect lines/pads 236a, 236b, 236e, and 236f may function as a hard mask layer for the etching process of the dielectric layers 238, 240, 140, and 138. A selective etching process may be employed to etch the dielectric layers 238, 240, 140, and 138 rapidly while etching only a portion of the second interconnect lines/pads 236a, 236b, 236e, and 236f. Further, the second interconnect line/pad 236 may function as an etch stop for the etching process. The etch process continues until the first interconnect lines/pads 136a and 136c are exposed, thereby forming via openings extending from a backside of the second substrate 200 to the interconnect lines/pads 136a, 136c, and 236g.

It should be noted that the etch process may extend through a variety of various layers used to form the dielectric layers, which may include various types of materials and etch stop layers. Accordingly, the etch process may utilize multiple etchants to etch through the various layers, wherein the etchants are selected based upon the materials being etched.

A conductive material is formed within the via openings. In an embodiment, the conductive material may be formed by depositing one or more diffusion and/or barrier layers and depositing a seed layer. For example, a diffusion barrier layer comprising one or more layers of Ta, TaN, TiN, Ti, CoW, or the like may be formed along the sidewalls of the via openings. The seed layer (not shown) may be formed of copper, nickel, gold, any combination thereof and/or the like. The diffusion barrier layer and the seed layer may be formed by suitable deposition techniques such as PVD, CVD, and/or the like. Once the seed layer has been deposited in the openings, a conductive material, such as tungsten, titanium, aluminum, copper, any combinations thereof and/or the like, is filled into the via openings, using, for example, an electro-chemical plating process or other suitable process. The filled via openings form vias 30, 32, and 34.

Excess materials, e.g., excess conductive materials and/or dielectric films, may be removed from the backside of the second semiconductor substrate 202. In embodiments, one or more of the layers of the multi-layer dielectric film may be left along a backside of the second semiconductor substrate 202 to provide additional protection from the environment. Any excess materials may be removed using an etch process, a planarization process (e.g., a CMP process), or the like.

Figure 5:
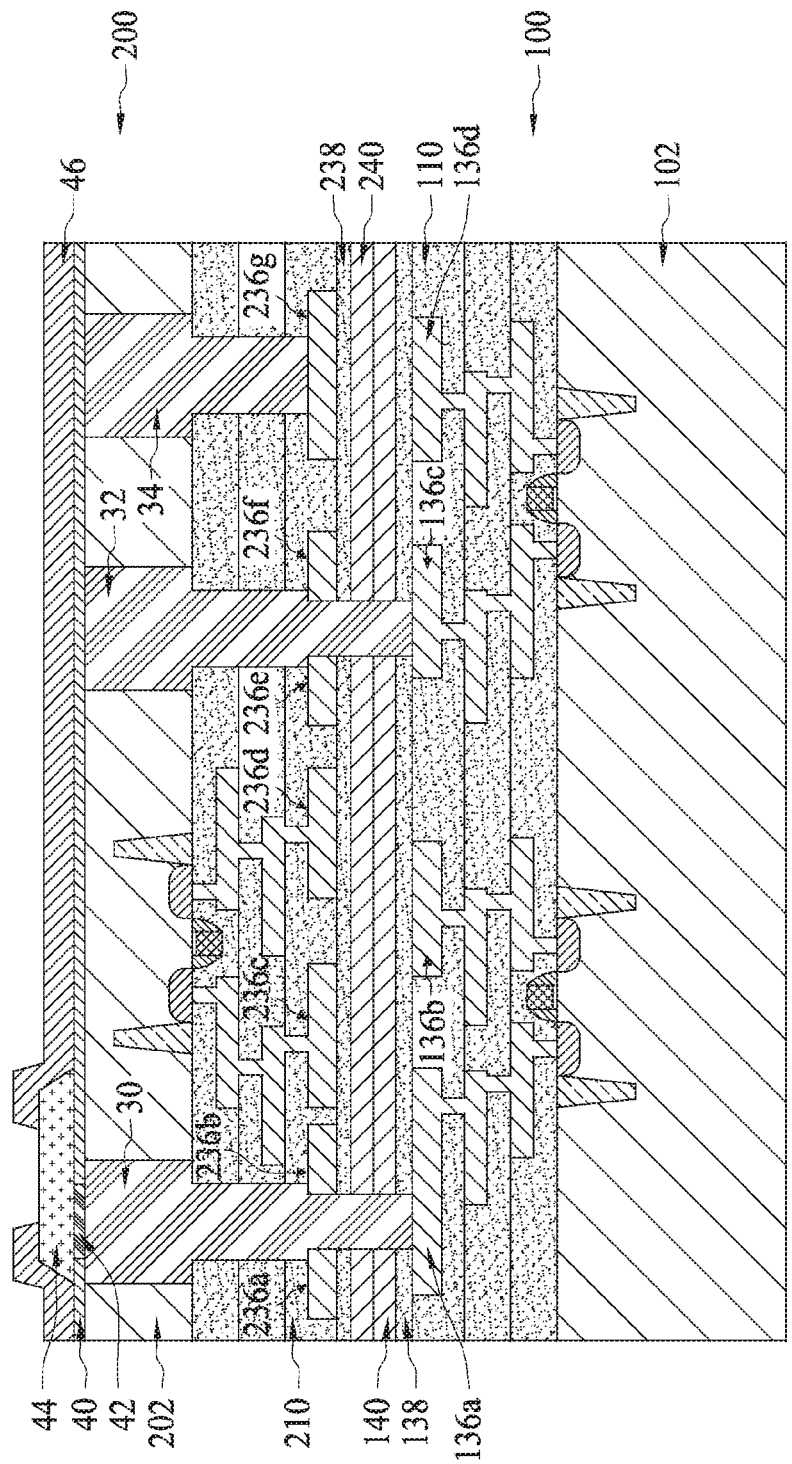

With reference to FIG. 5, a dielectric capping layer 40 is formed along a backside of the second semiconductor substrate 202. The dielectric capping layer 40 may comprise one or more layers of dielectric materials, such as silicon nitride, silicon oxynitride, silicon oxycarbide, silicon carbide, combinations thereof, and multi-layers thereof formed by, for example, using suitable deposition techniques such as sputtering, CVD, and the like.

A via 42 is formed through the dielectric capping layer 40. The via 42 may be formed, for example, by using photolithography techniques to deposit and pattern a photoresist material on the dielectric capping layer 40 to expose the portion of the dielectric capping layer 40 that is to become the dielectric capping layer 40. An etch process, such as an anisotropic dry etch process, may be used to create an opening in the dielectric capping layer 40. The opening may be lined with a diffusion barrier layer and/or an adhesion layer (not shown), and filled with a conductive material. The diffusion barrier layer may comprise one or more layers of TaN, Ta, TiN, Ti, CoW, or the like, and the conductive material may comprise copper, tungsten, aluminum, silver, and combinations thereof, or the like, thereby forming the via 42 as illustrated in FIG. 5.

A conductive pad 44 is formed over and in electrical contact with the via 42 and over the dielectric capping layer 40. The conductive pad 44 may comprise aluminum, but other materials, such as copper, may be used. The conductive pad 44 may be formed using a deposition process, such as sputtering or other suitable process, to form a layer of material, and thereafter, portions of the layer of material may be removed through a suitable process (such as photolithographic masking and etching) to form the conductive pad 44. However, any suitable process may be utilized to form the conductive pad 44.

A passivation layer 46 is formed on the dielectric capping layer 40 and the conductive pad 44. The passivation layer 46 may comprise one or more suitable dielectric materials such as silicon oxide, silicon nitride, combinations of these, or the like. The passivation layer 46 may be formed using, for example, CVD, PECVD, or any suitable process. After the passivation layer 46 has been formed, an opening may be made through the passivation layer 46 to the conductive pad 44 by removing a portion of the passivation layer 46 to expose at least a portion of the underlying conductive pad 44. The opening may be formed using a suitable photolithographic and etching process.

Figure 6:
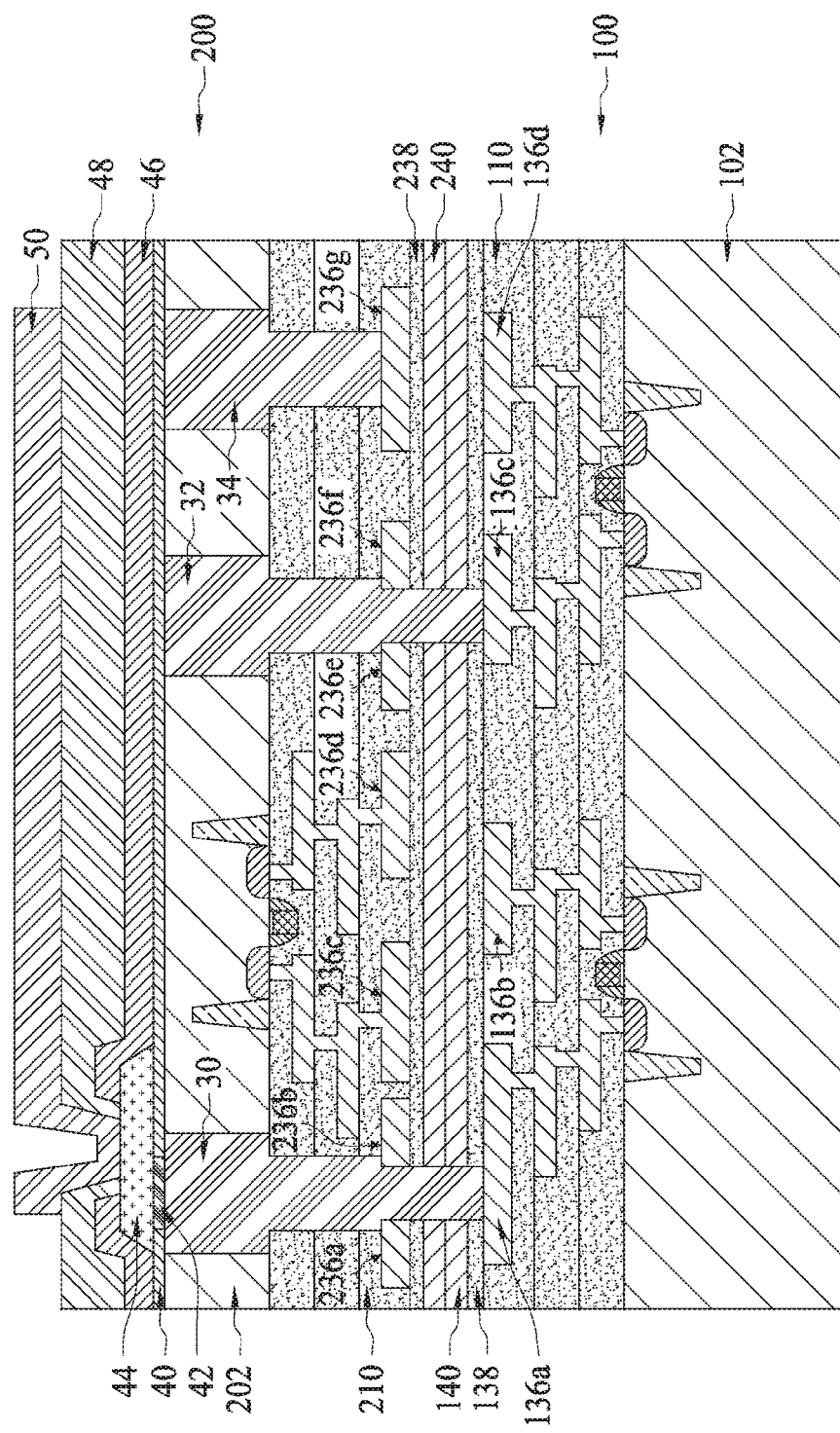

With reference to FIG. 6, a first stress buffer layer 48 is formed over the passivation layer 46. The first stress buffer layer 48 may absorb stress to prevent the stress from penetrating into the second substrate 200, for example. A material of the first stress buffer layer 48 can have a Young's modulus between about 2 GPa and about 4 GPa, and more specifically, between about 2 GPa and about 3 GPa, such as about 2.1 GPa. Additionally, the material of the first stress buffer layer 48 can have a tensile strength between 90 MPa and about 200 MPa, and more specifically, between about 120 MPa and about 170 MPa, such as about 145 MPa. Further, the material of the first stress buffer layer 48 can have an elongation between about 5% and about 50%, and more specifically, between about 30% and about 50%, such as about 40%, before rupture. The first stress buffer layer 48 may be formed of a polymer such as a polyimide, polybenzoxazole (PBO), benzocyclobutene (BCB), and the like. The first stress buffer layer 48 may be formed by spin coating, laminating, or the like. The first stress buffer layer 48 is patterned to form an opening through the opening in the passivation layer 46 and through which the conductive pad 44 is exposed. The patterning of first stress buffer layer 48 may include photolithography techniques. A curing step may be performed to cure the first stress buffer layer 48. The first stress buffer layer 48 can have a thickness between about 3 µm and about 10 µm, and more specifically, between about 5 µm and about 7 µm, such as about 6 µm. Although one first stress buffer layer 48 is illustrated in FIG. 6, multiple stress buffer layers may be formed.

A post-passivation interconnect (PPI) 50 is formed over the first stress buffer layer 48 and fills the opening in the first stress buffer layer 48 and the passivation layer 46, thereby forming an electrical connection with the conductive pad 44. The PPI 50 may be utilized as a redistribution layer to allow a subsequently formed under bump metal (UBM) that is electrically connected to the conductive pad 44 to be placed in any desired location on the second substrate 200. In an embodiment, the PPI 50 may be formed by forming a seed layer, which may comprise a titanium copper alloy, using a suitable formation process such as physical vapor deposition (PVD), sputtering, or the like. A photoresist may then be formed to cover the seed layer and patterned to expose portions of the seed layer that are located where the PPI 50 is desired to be located.

Once the photoresist has been formed and patterned, a conductive material, such as copper, may be formed on the seed layer through a deposition process such as plating. While the material and methods discussed are suitable to form the conductive material, these materials and methods are merely examples. Any other suitable materials, such as AlCu or Au, and any other suitable processes of formation, such as CVD or PVD, may be used to form the PPI 50.

Once the conductive material has been formed, the photoresist may be removed through a suitable removal process such as ashing, such as by using an oxygen plasma. Additionally, after the removal of the photoresist, the portions of the seed layer that were covered by the photoresist may be removed through, for example, a suitable etch process.

Figure 7:
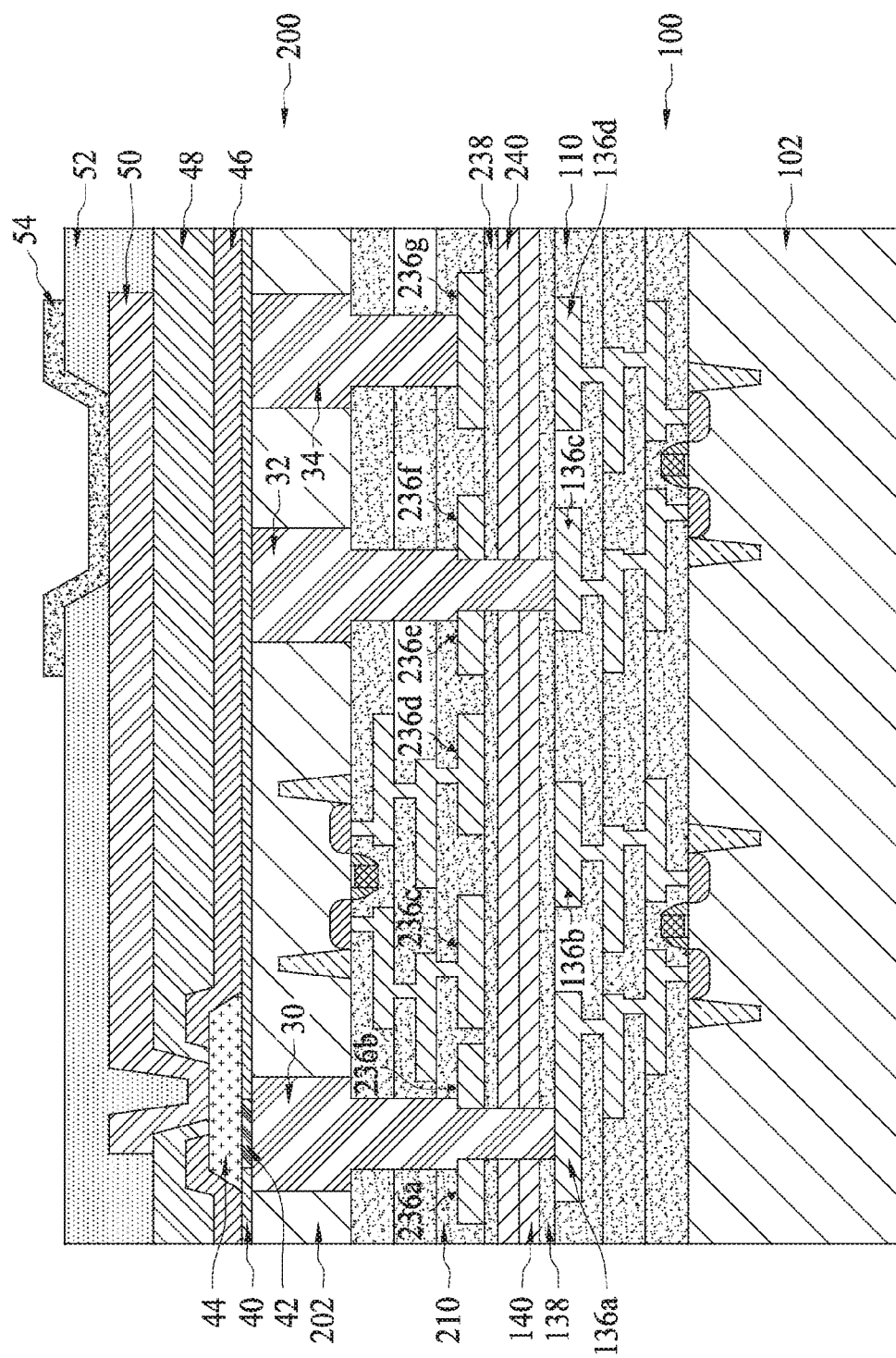

With reference to FIG. 7, a second stress buffer layer 52 is formed over the PPI 50 and the first stress buffer layer 48. The second stress buffer layer 52 may also absorb stress to prevent the stress from penetrating into the second substrate 200, for example. A material of the second stress buffer layer 52 can have a Young's modulus between about 2 GPa and about 4 GPa, and more specifically, between about 2 GPa and about 3 GPa, such as about 2.1 GPa. Additionally, the material of the second stress buffer layer 52 can have a tensile strength between 90 MPa and about 200 MPa, and more specifically, between about 120 MPa and about 170 MPa, such as about 145 MPa. Further, the material of the second stress buffer layer 52 can have an elongation between about 5% and about 50%, and more specifically, between about 30% and about 50%, such as about 40%, before rupture. The second stress buffer layer 52 may be formed of a polymer such as a polyimide, PBO, BCB, and the like. The second stress buffer layer 52 may be formed by spin coating, laminating, or the like. The second stress buffer layer 52 is patterned to form an opening through which the PPI 50 is exposed. The patterning of the second stress buffer layer 52 may include photolithography techniques. A curing step may be performed to cure the second stress buffer layer 52. The second stress buffer layer 52 can have a thickness between about 3 µm and about 10 µm, and more specifically, between about 5 µm and about 7 µm, such as about 6 µm. Although one second stress buffer layer 52 is illustrated in FIG. 7, multiple stress buffer layers may be formed.

A UBM 54 may be formed in the opening in the second stress buffer layer 52 and in electrical contact with the PPI 50. The UBM 54 may comprise three layers of conductive materials, such as a layer of titanium, a layer of copper, and a layer of nickel. One of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that may be suitable for the formation of the UBM 54.

The UBM 54 may be formed by forming each layer over the second stress buffer layer 52 and along the interior of the opening through the second stress buffer layer 52 to the PPI 50. Each layer may be formed using a plating process, such as electrochemical plating, although other processes of formation, such as sputtering, evaporation, or PECVD process, may be used. Once the desired layers have been formed, portions of the layers may then be removed through a suitable photolithographic masking and etching process to remove the undesired material and to leave the UBM 54 in a desired shape, such as a circular, octagonal, square, or rectangular shape, although any desired shape may alternatively be formed.

Figure 8:
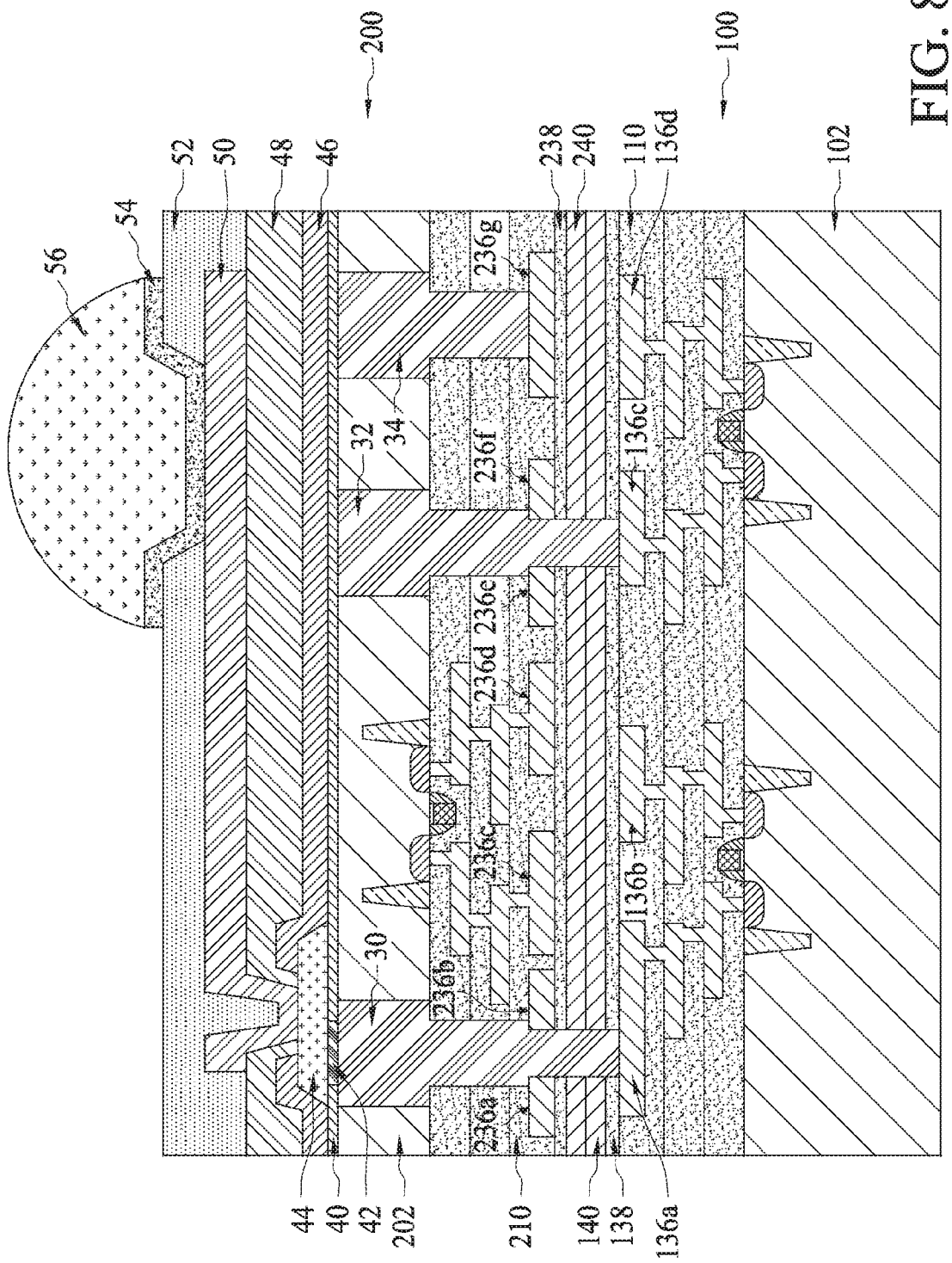

With reference to FIG. 8, a contact bump 56 is formed on the UBM 54. The contact bump 56 may be a controlled collapse chip connection ($C_4$) and/or may comprise a material such as solder, tin, or other suitable materials, such as silver, lead-free tin, or copper. In an embodiment in which the contact bump 56 is a tin solder bump, the contact bump 56 may be formed by initially forming a layer of tin through evaporation, electroplating, printing, solder transfer, ball placement, etc. Once a layer of tin has been formed on the structure, a reflow may be performed in order to shape the material into the desired bump shape. Other bump structures may be used. For example, a metal pillar with a solder connector may also be used.

Figure 9:
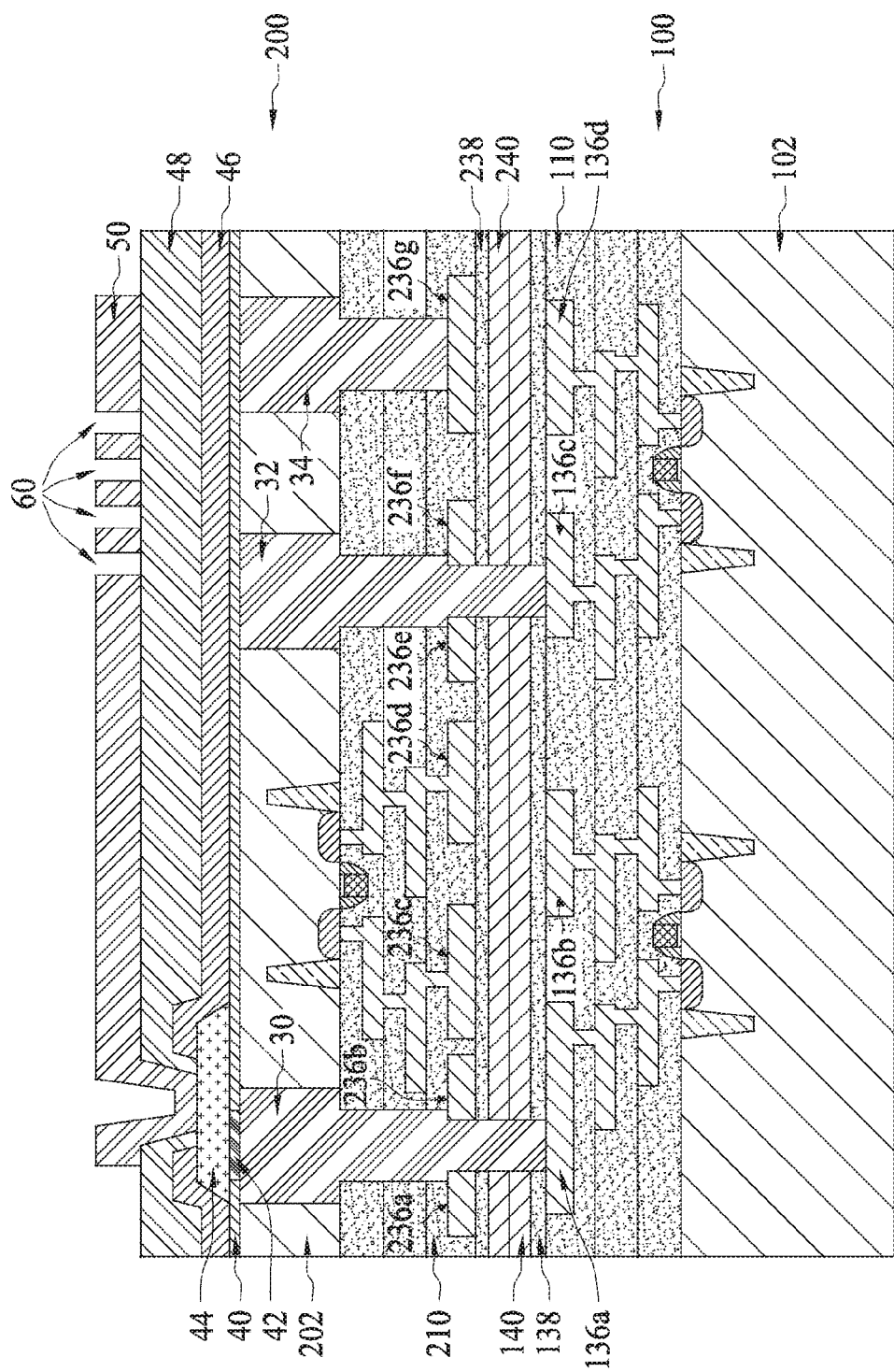
FIG. 9 is a modification of FIG. 6 in accordance with some embodiments.
Figure 10A:
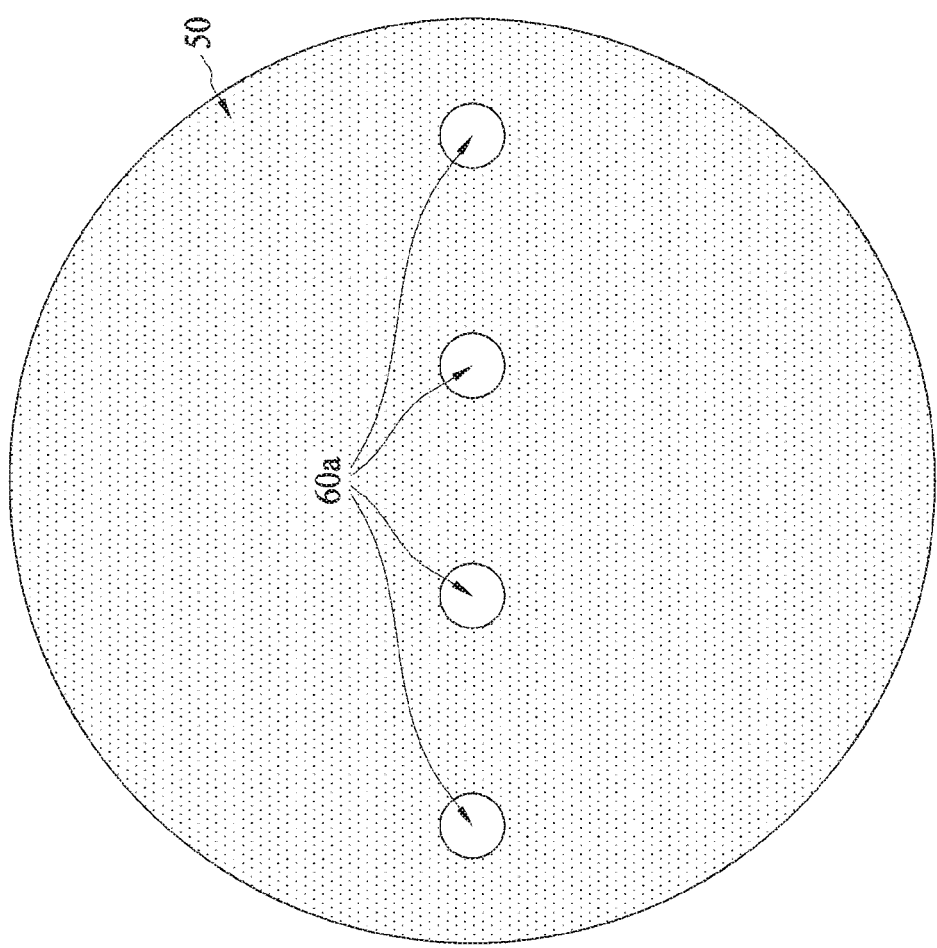
Figure 10B:
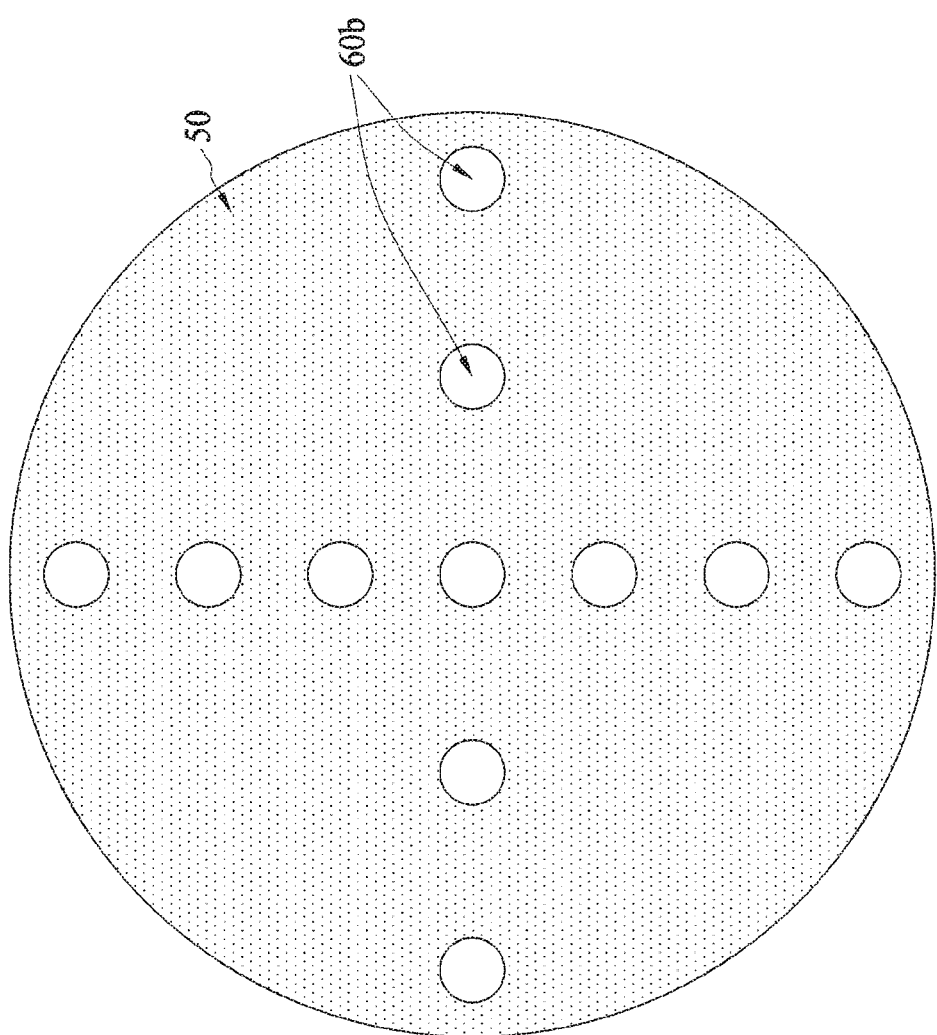
Figure 10C:
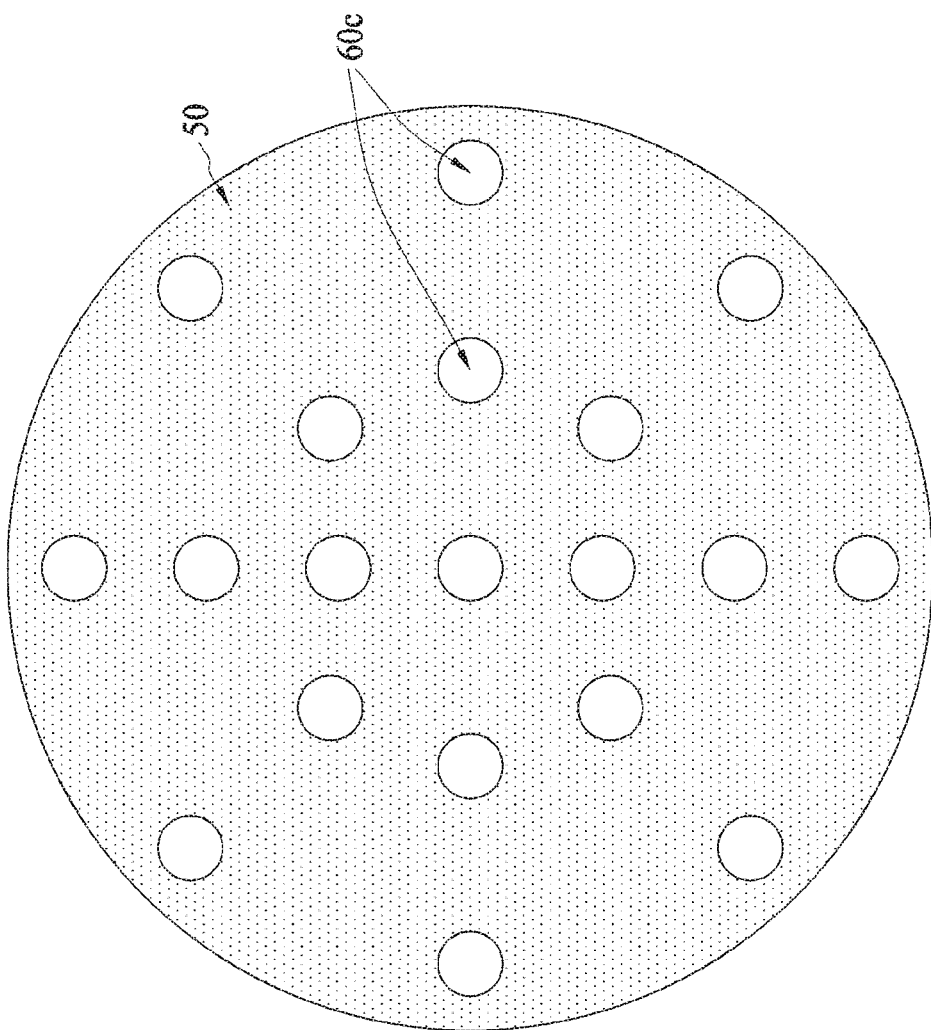
Figure 10E:
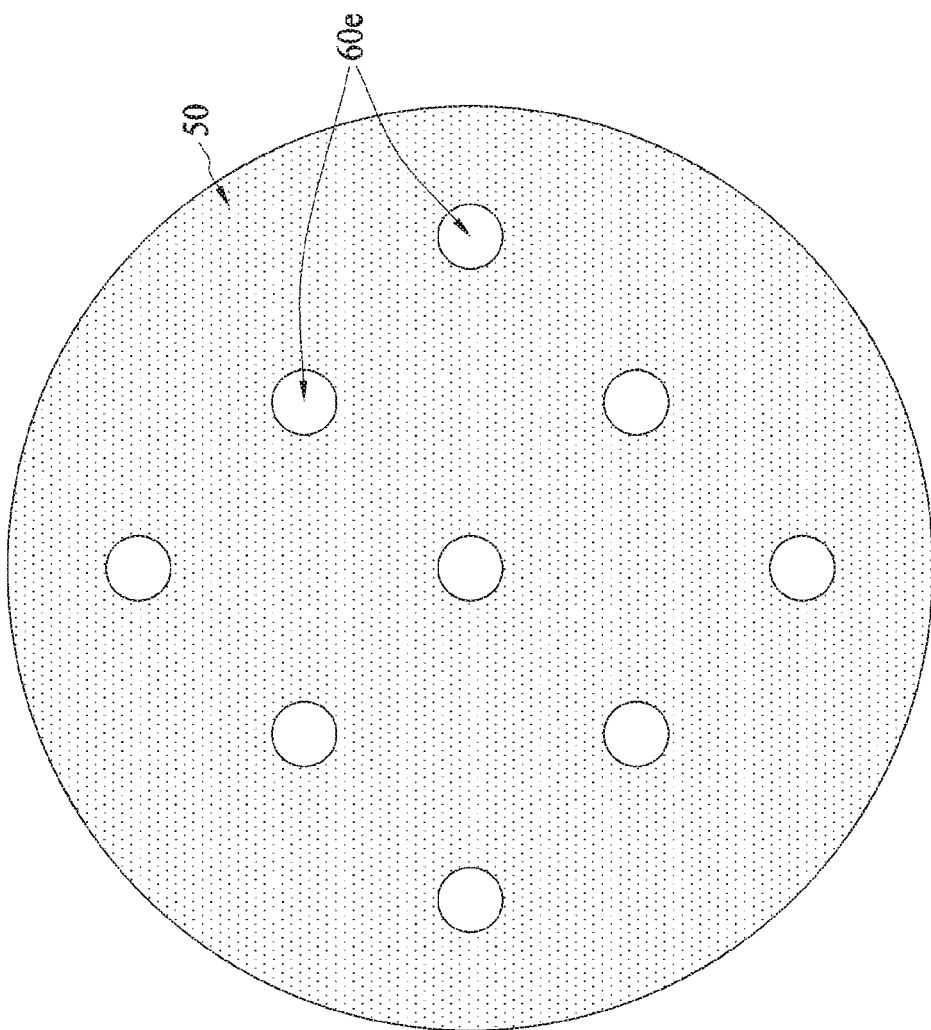
Figure 11:
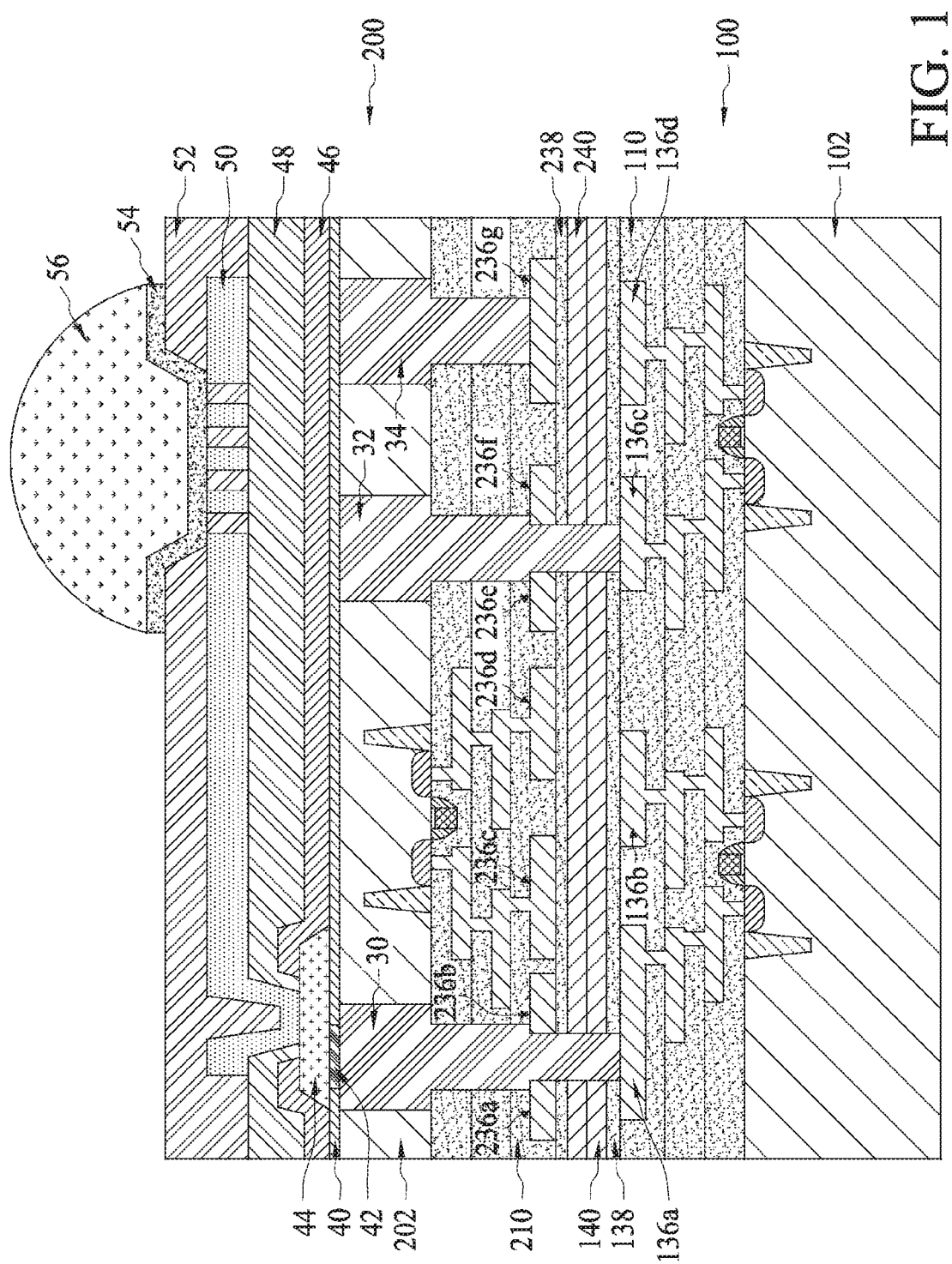
FIG. 11 is a cross-sectional view of a bonded structure including the modification of FIG. 9 in accordance with some embodiments.

FIGS. 9 through 11 illustrate a modification to the embodiment illustrated in FIGS. 1A, 1B, and 2-8. FIG. 9 is similar to FIG. 6 discussed above. The PPI 50 is patterned with openings 60 in an area of the PPI 50 on which the UBM 54 will be formed. FIGS. 10A through 10E are example layout views of a portion of the PPI 50 with the openings 60. This portion of the PPI 50 in FIGS. 10A through 10E is under the UBM 54 in FIG. 11. In FIG. 10A, openings 60a arranged in a single line are formed through the PPI 50. In FIG. 10B, openings 60b arranged in two transverse, intersecting lines are formed through the PPI 50. In FIG. 10C, openings 60c arranged in four transverse, intersecting lines are formed through the PPI 50. In FIG. 10D, openings 60d arranged in a 5×5 array are formed through the PPI 50. In FIG. 10E, openings 60e arranged in a 3×3 array are formed through the PPI 50. These layout views are examples, and other arrangements of openings 60 may also be used.

FIG. 11 is similar to FIG. 8 discussed above. As illustrated, the second stress buffer layer 52 fills the openings 60 in the PPI 50. With the openings 60 and second stress buffer layer 52 in the openings 60 in the PPI 50, stress may be further absorbed and prevented from penetrating into the second substrate 200.

Figure 12A:
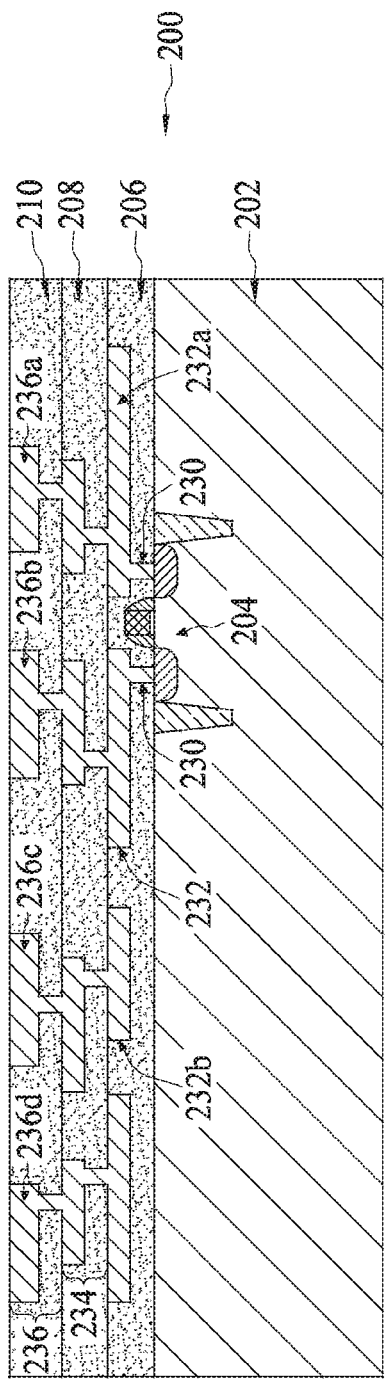
FIGS. 12A, 12B, and 13-19 are various cross-sectional views of structures in intermediate steps of forming a bonded structure in accordance with other embodiments.
Figure 12B:
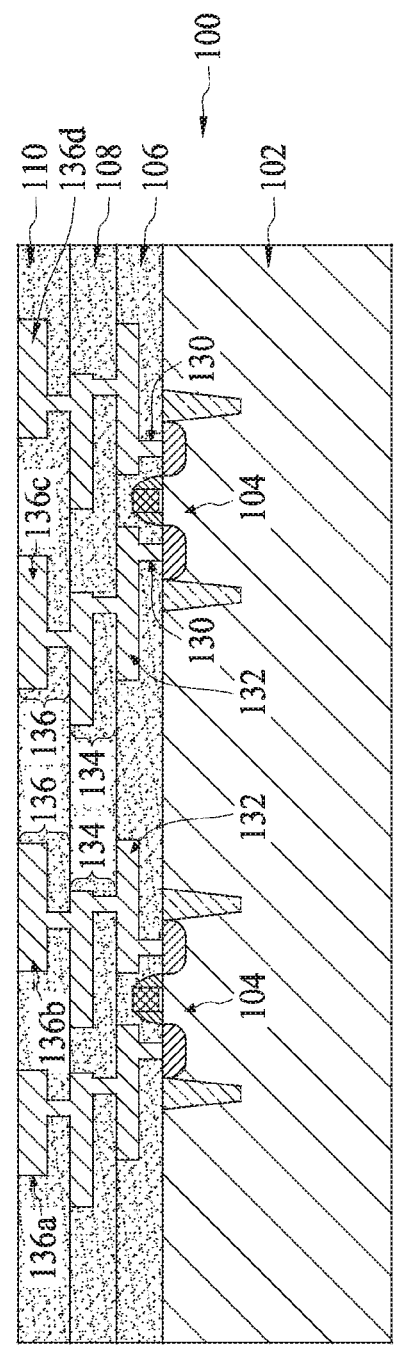

FIGS. 12A, 12B, and 13-19 illustrate various cross-sectional views of structures in intermediate steps of forming a bonded structure in accordance with another embodiment. FIGS. 12A and 12B illustrate a first substrate 100 and a second substrate 200 similar to what was previously discussed with respect to FIGS. 1A and 1B. The first substrate 100 and the second substrate 200 in FIGS. 12A and 12B illustrate that metallization patterns 132, 134, 136, 232, 234, and 236 may have various configurations. For ease of discussion herein, second interconnect lines/pads 232a and 236b in the second ILD layer 206 in the second substrate 200 are labeled. Further, in this embodiment, bonding between the first substrate 100 and the second substrate 200 may use a different mechanism, as discussed further below, and as such, omits the additional dielectric layers 138 and 238 and the bonding dielectric layers 140 and 240.

Figure 13:
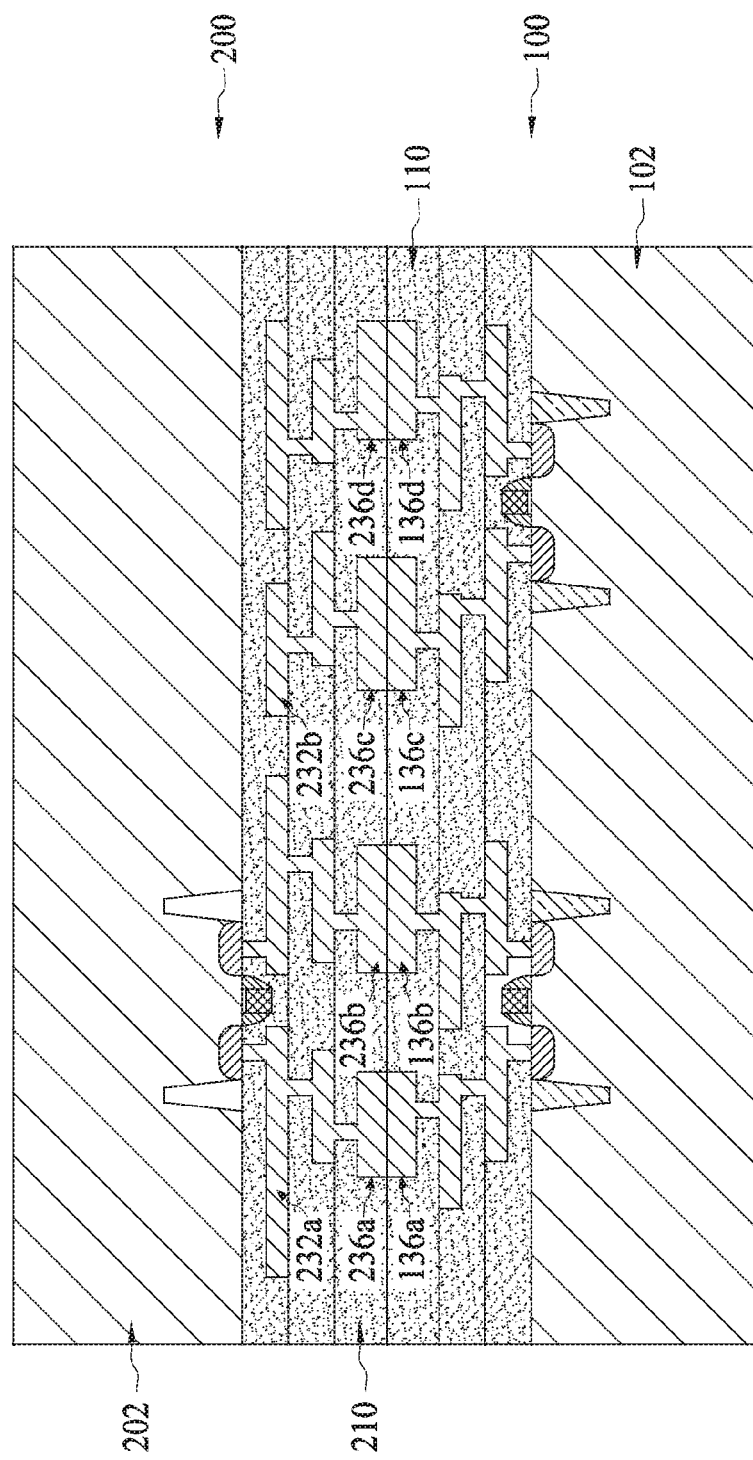

With reference to FIG. 13, the first substrate 100 and the second substrate 200 are arranged with the device sides of the first semiconductor substrate 102 and the second semiconductor substrate 202 facing each other and are bonded. In the illustrated embodiment, the first substrate 100 and the second substrate 200 are bonded together using a direct bonding process such as metal-to-metal bonding (e.g., copper-to-copper bonding), metal-to-dielectric bonding (e.g., oxide-to-copper bonding), or a combination thereof. For example, the IMD layers 110 and 210 are bonded together, the interconnect lines/pads 136a and 236a are bonded together, the interconnect lines/pads 136b and 236b are bonded together, the interconnect lines/pads 136c and 236c are bonded together, and the interconnect lines/pads 136d and 236d are bonded together. Additionally, one or more of the first interconnect lines/pads 136a, 136b, 136c, and 136d may be bonded to the second IMD layer 210, and one or more of the second interconnect lines/pads 236a, 236b, 236c, and 236d may be bonded to the first IMD layer 110.

Figure 14:
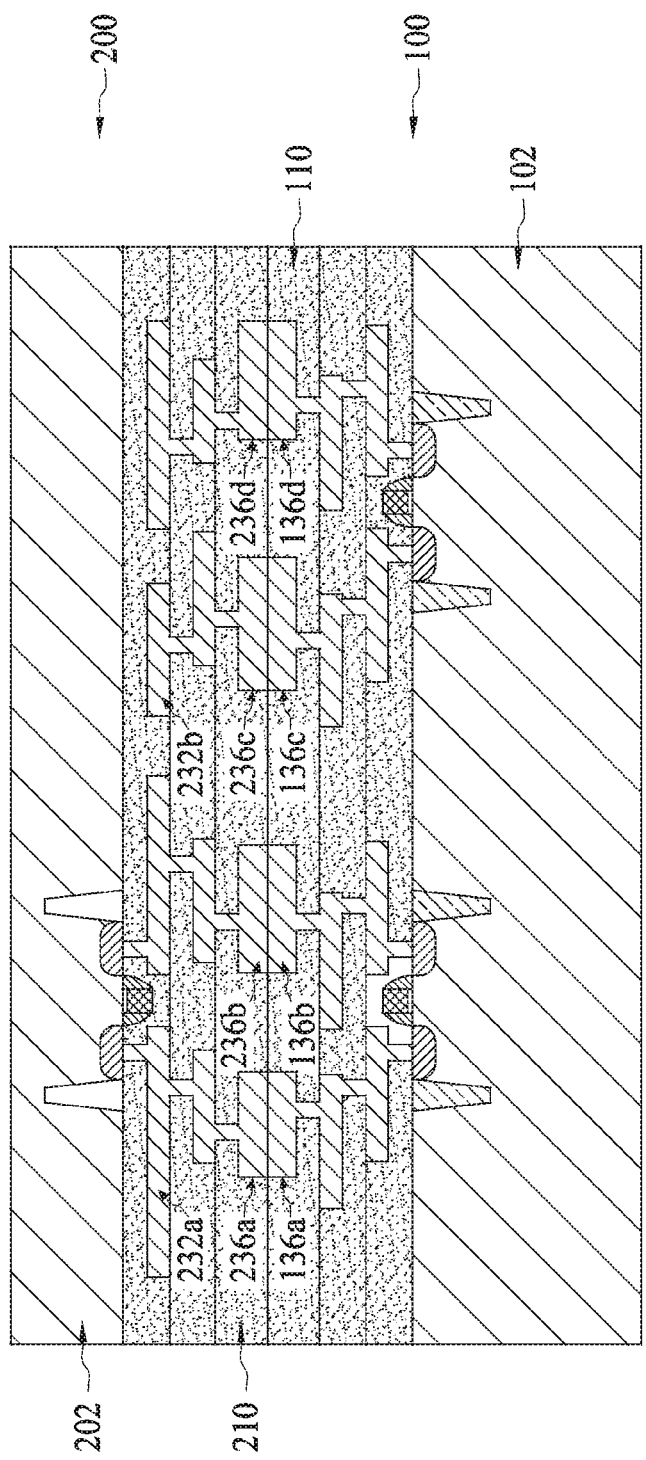

With reference to FIG. 14, as discussed with respect to FIG. 3, after the first substrate 100 and the second substrate 200 are bonded, a thinning process may be applied to the backside of the second substrate 200. In an embodiment, the backside of the second substrate 200 may be thinned by using suitable techniques such as grinding, polishing, a SMARTCUT® procedure, an ELTRAN® procedure, and/or chemical etching.

Figure 15:
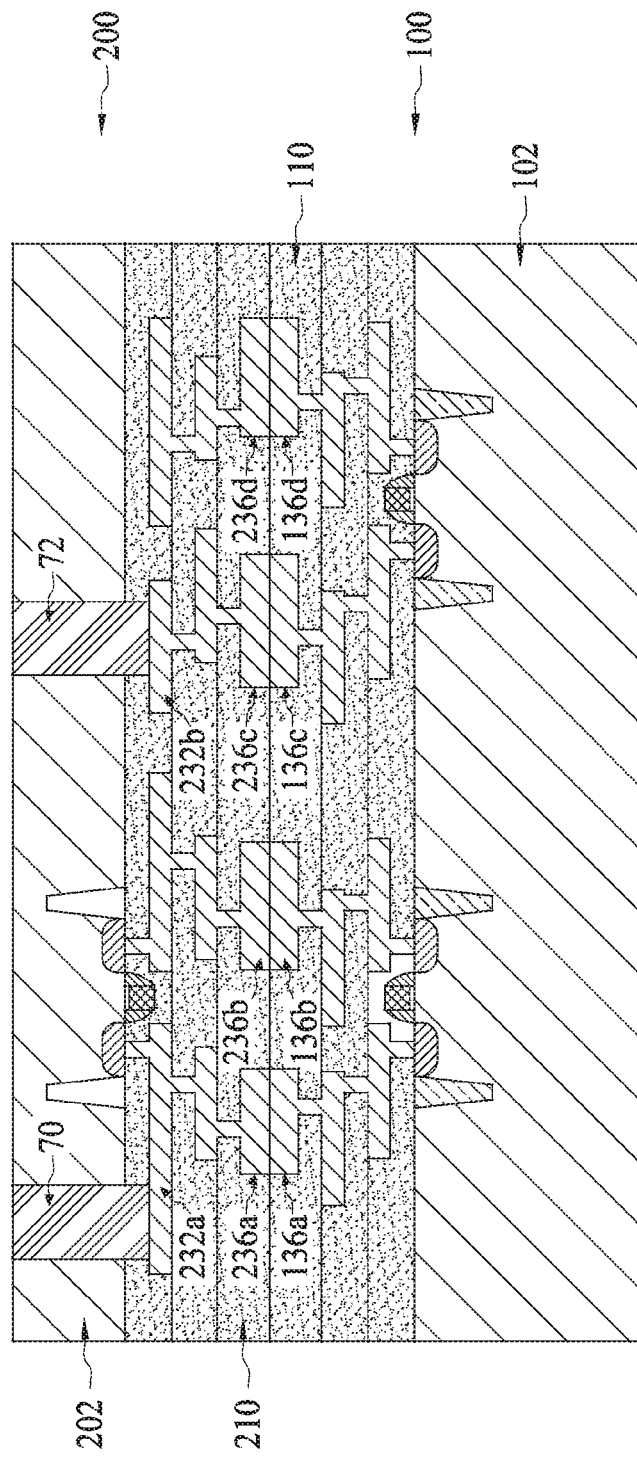
Figure 16:
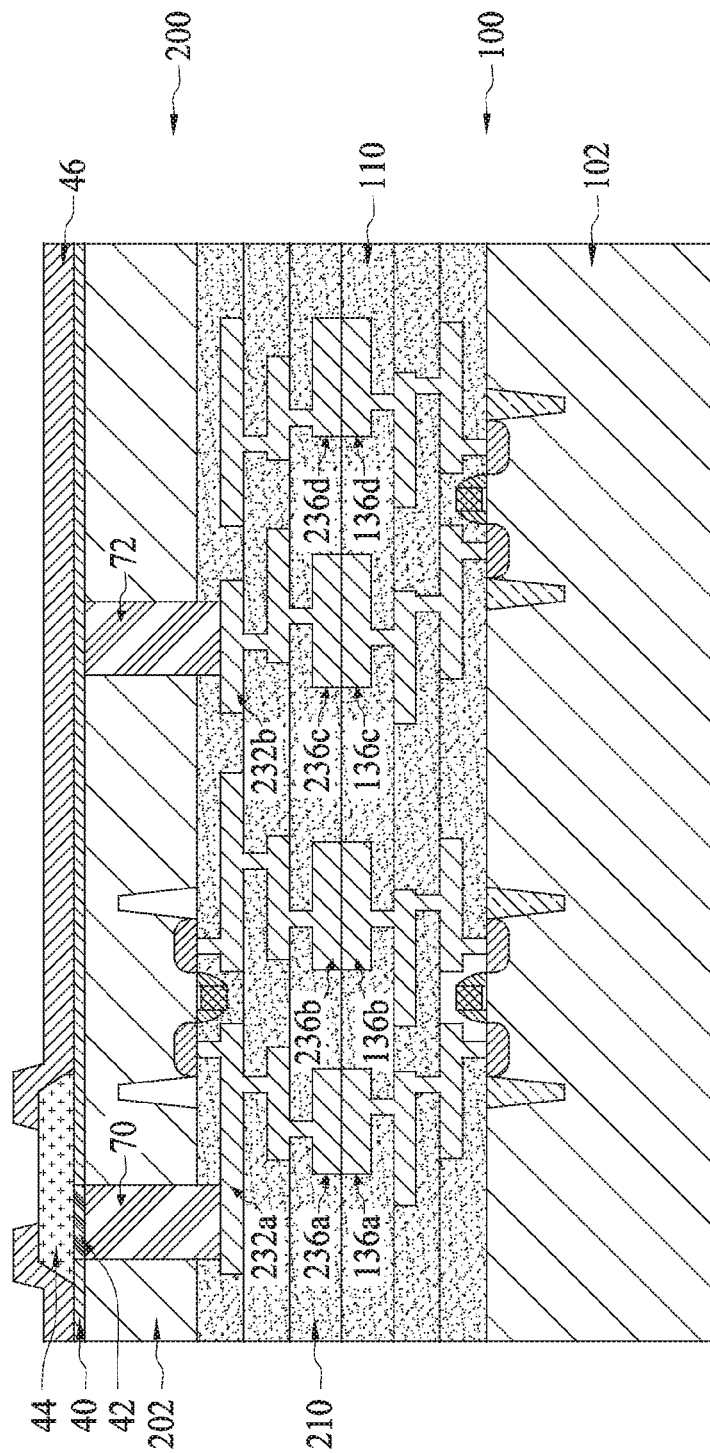
Figure 17:
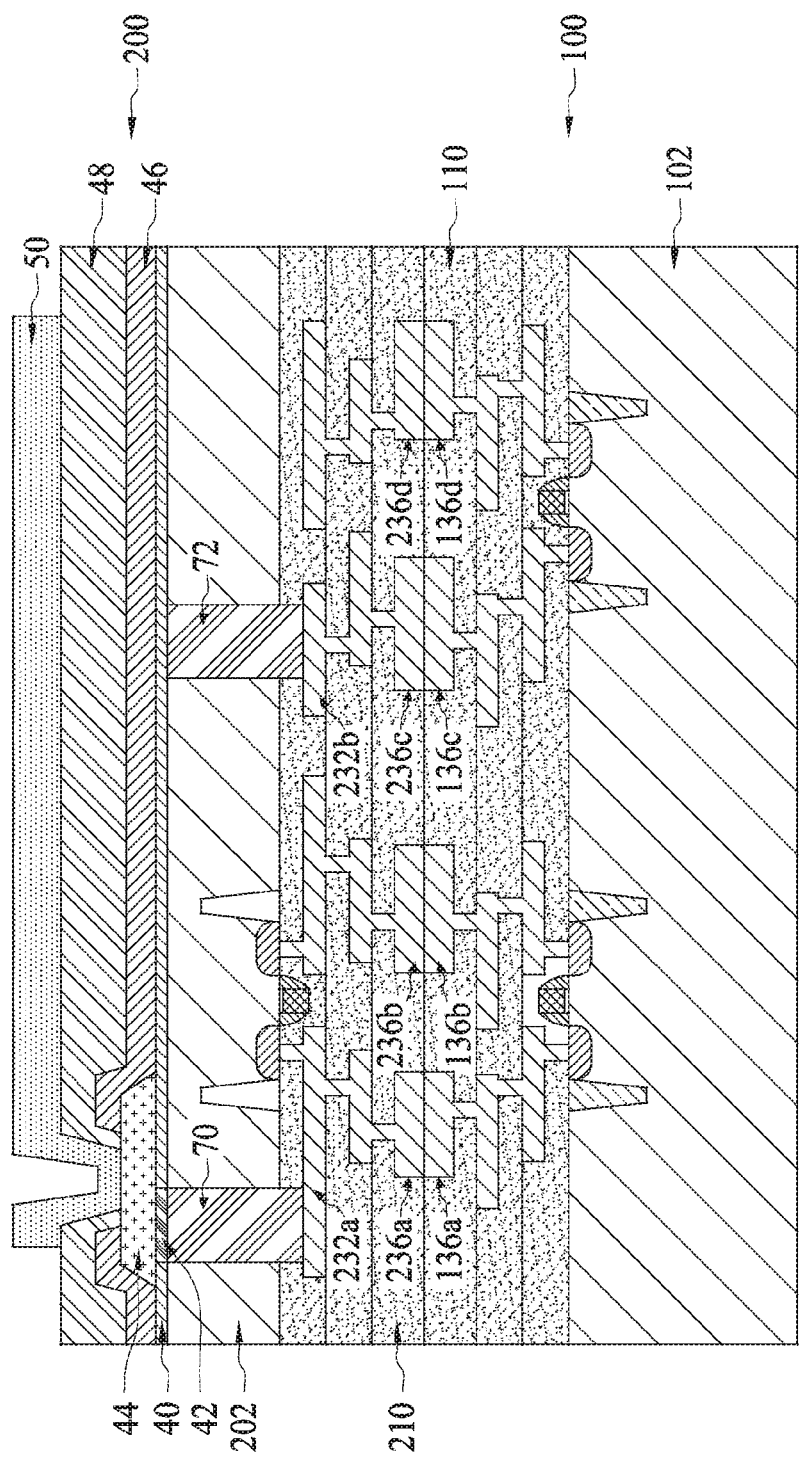
Figure 18:
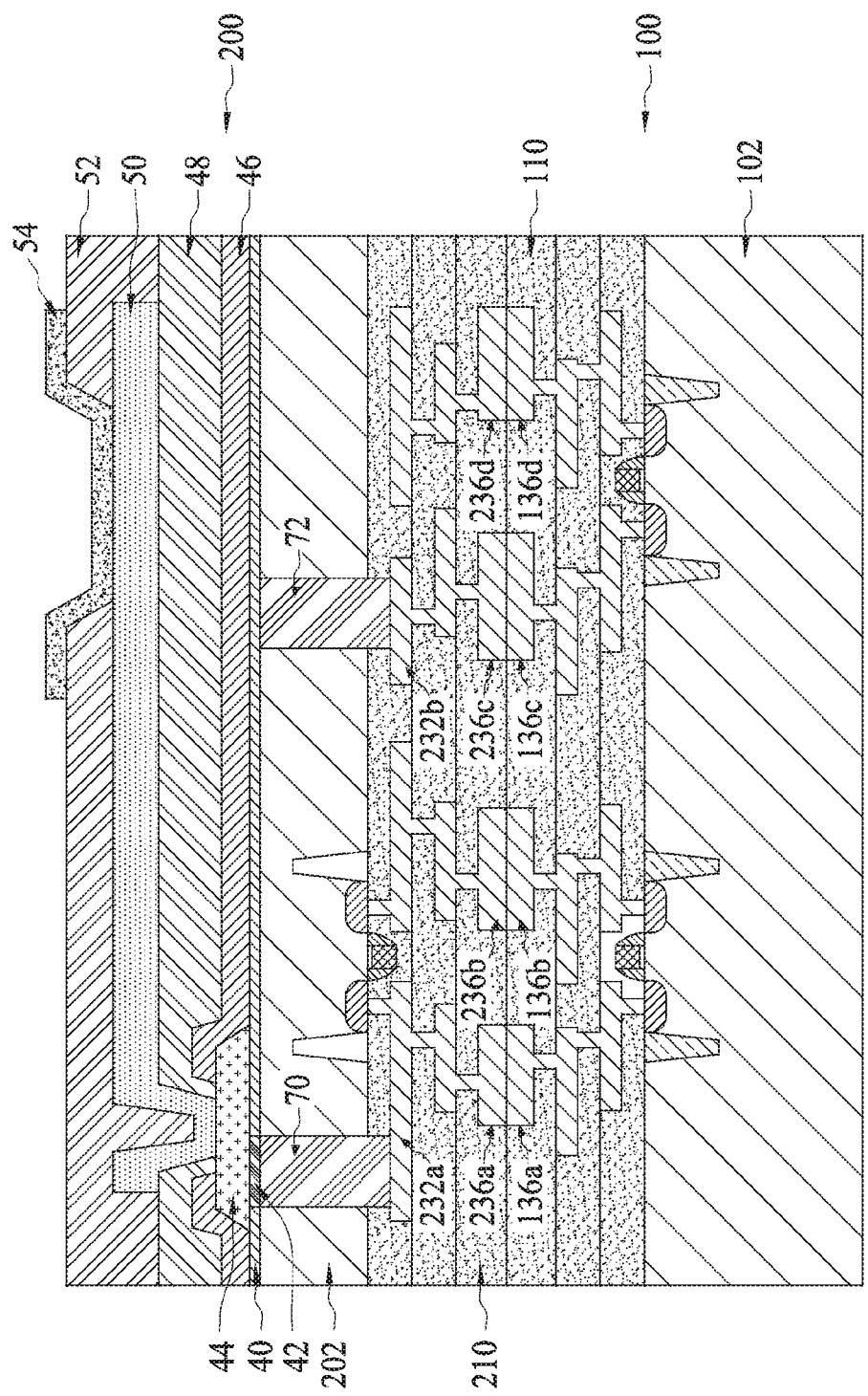
Figure 19:
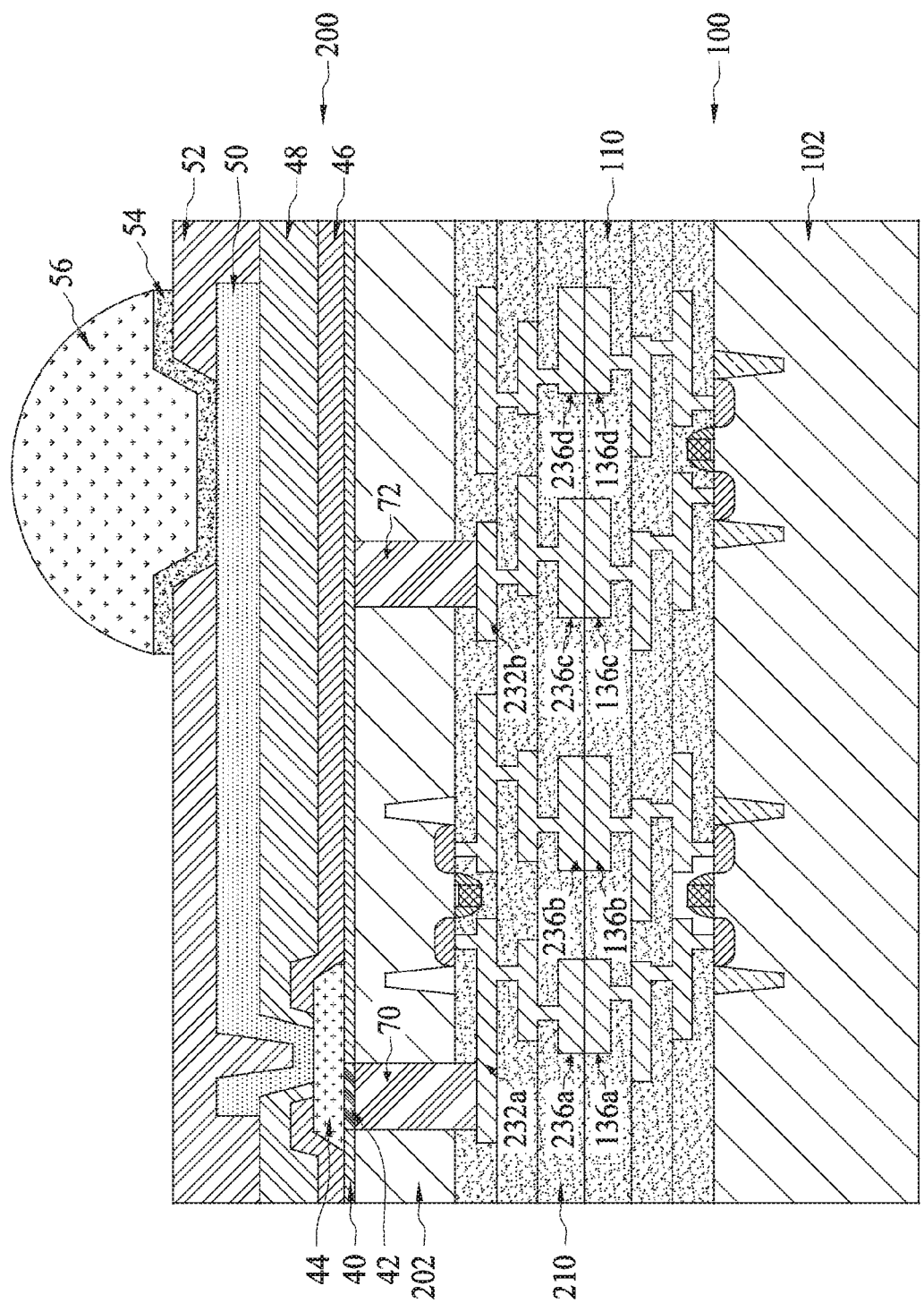

With reference to FIG. 15, through vias 70 and 72 are formed. As discussed in greater detail below, an electrical connection will be formed extending from a backside of the second substrate 200 to select ones of the second interconnect lines/pads 232a and 232b.

First, openings are formed for the vias 70 and 72 through the second semiconductor substrate 202. The openings may be formed using photolithography techniques, for example, to deposit and pattern a photoresist material on the second semiconductor substrate 202 to expose the second semiconductor substrate 202 where the openings will be formed. An etch process, such as an anisotropic dry etch process, may be used to create the openings in the second semiconductor substrate 202. Various layers may be present on the second semiconductor substrate 202 during these processes, such as hardmask layer(s), anti-reflection coating (ARC) layer(s), the like, or a combination thereof.

One or more dielectric film(s) can be formed over the backside of the second semiconductor substrate 202 and along sidewalls of the openings in the second semiconductor substrate 202. A dielectric film(s) can provide passivation and isolation between through vias and device circuits and can provide protection to the second semiconductor substrate 202 during, for example, a subsequent etch process. Further, a dielectric film(s) may provide protection against metal ions diffusing into the second semiconductor substrate 202.

In an embodiment, a multi-layered dielectric film is formed along the backside of the second semiconductor substrate 202 and in the openings. The multi-layered dielectric film comprises a first dielectric film and a second dielectric film over the first dielectric film. The materials of the first dielectric film and the second dielectric film are selected such that there is a relatively high etch selectivity between the two layers. An example of dielectric materials that may be used is a nitride material for the first dielectric film and an oxide for the second dielectric film. The nitride layer, such as a silicon nitride ($Si_3N_4$) layer, may be formed using CVD techniques. The oxide layer, such as a silicon dioxide layer, may be formed by thermal oxidation or by CVD techniques. Other materials, including other oxides, other nitrides, SiON, SiC, low k dielectric materials (e.g., Black Diamond), and/or high k oxides (e.g., $HfO_2$, $Ta_2O_5$) may be used. Spacer-shaped structures are formed from the second dielectric film using, for example, a dry etch process such that the second dielectric film is etched while causing little or no damage to the first dielectric film.

A patterned mask is formed over the backside of the second semiconductor substrate 202, which may be, for example, a photoresist material that has been deposited, masked, exposed, and developed as part of a photolithography process. The patterned mask is patterned to define via openings extending through the respective openings through the second semiconductor substrate 202 and through the second ILD layer 206, thereby exposing portions of select ones of the second interconnect lines/pads 232a and 232b, as explained in greater detail below. One or more etching processes are performed to form these via openings. A suitable etching process, such as a dry etch, an anisotropic wet etch, or any other suitable anisotropic etch or patterning process, may be performed to form the via openings.

As can be seen by FIG. 15, the via opening for via 70 extends to the second interconnect line/pad 232a. The via opening for via 72 extends to the second interconnect line/pad 232b. In an embodiment, the second interconnect lines/pads 232a and 232b are formed of a suitable metal material, such as copper, which may function as an etch stop. A selective etching process may be employed to etch the dielectric second ILD layers 206. The etch process continues until the second interconnect lines/pads 232a and 232b are exposed, thereby forming a via opening extending from a backside of the second substrate 200 to the interconnect lines/pads 232a and 232b.

It should be noted that the etch process may extend through a variety of various layers used to form the dielectric layers, which may include various types of materials and etch stop layers. Accordingly, the etch process may utilize multiple etchants to etch through the various layers, wherein the etchants are selected based upon the materials being etched.

A conductive material is formed within the via openings. In an embodiment, the conductive material may be formed by depositing one or more diffusion and/or barrier layers and depositing a seed layer. For example, a diffusion barrier layer comprising one or more layers of Ta, TaN, TiN, Ti, CoW, or the like may be formed along the sidewalls of the via openings. The seed layer (not shown) may be formed of copper, nickel, gold, any combination thereof and/or the like. The diffusion barrier layer and the seed layer may be formed by suitable deposition techniques such as PVD, CVD, and/or the like. Once the seed layer has been deposited in the openings, a conductive material, such as tungsten, titanium, aluminum, copper, any combinations thereof and/or the like, is filled into the via openings, using, for example, an electro-chemical plating process or other suitable process. The filled via openings form vias 70 and 72. As discussed previously, excess materials, e.g., excess conductive materials and/or dielectric films, may be removed from the backside of the second semiconductor substrate 202.

With reference to FIGS. 16 through 19, processing continues as discussed above with respect to FIGS. 5 through 8 to form a dielectric capping layer 40, a via 42 through the dielectric capping layer 40, a conductive pad 44 over and in electrical contact with the via 42 and over the dielectric capping layer 40, a passivation layer 46 on the dielectric capping layer 40 and the conductive pad 44, a first stress buffer layer 48 over the passivation layer 46, a PPI 50 over the first stress buffer layer 48, a second stress buffer layer 52 over the PPI 50 and the first stress buffer layer 48, a UBM 54 in an opening in the second stress buffer layer 52 and in electrical contact with the PPI 50, and a contact bump 56 on the UBM 54.

Figure 20:
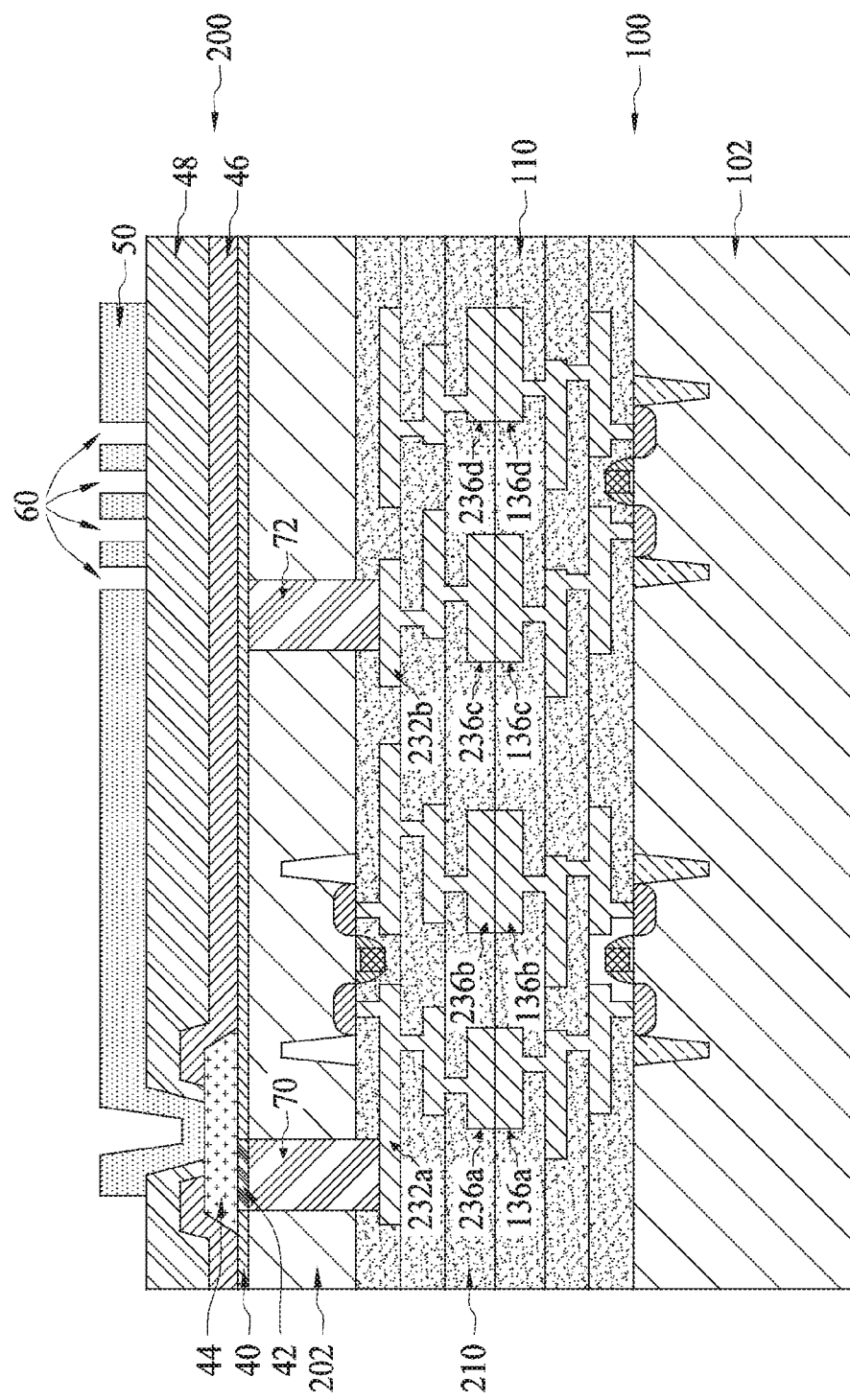
FIG. 20 is a modification of FIG. 17 in accordance with some embodiments.
Figure 21:
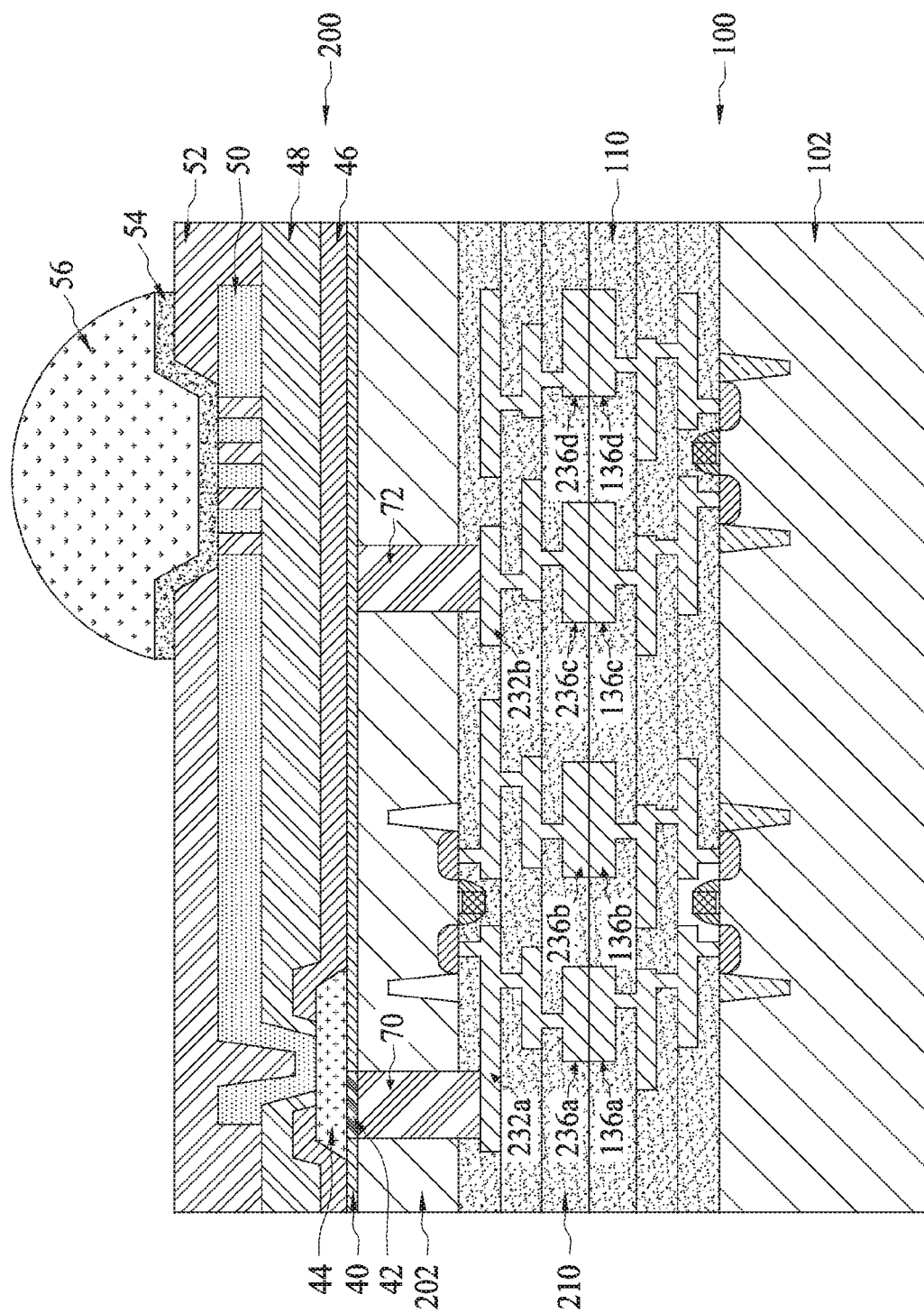
FIG. 21 is a cross-sectional view of a bonded structure including the modification of FIG. 20 in accordance with some embodiments.

FIGS. 20 and 21 illustrate a modification to the embodiment illustrated in FIGS. 12A, 12B, and 13-19. FIG. 20 is similar to FIG. 17 discussed above. The PPI 50 is patterned with openings 60 in an area of the PPI 50 on which the UBM 54 will be formed. As with a previous embodiment, FIGS. 10A through 10E are layout views of the PPI 50 with the openings 60. These layout views are examples, and other arrangements of openings 60 may also be used. FIG. 21 is similar to FIG. 19 discussed above. As illustrated, the second stress buffer layer 52 fills the openings 60 in the PPI 50. With the openings 60 and second stress buffer layer 52 in the openings 60 in the PPI 50, stress may be further absorbed and prevented from penetrating into the second substrate 200.

As discussed throughout, embodiments may include stress buffer layers, such as the first stress buffer layer 48 and the second stress buffer layer 52, in a stacked and/or bonded structure. The stress buffer layers may absorb stress caused, for example, by thermal cycling and thermal expansion mismatch after the bonded structure is attached to a further, different substrate, such as by bumps 56. The absorption of stress by the stress buffer layers may prevent stress from reaching and affecting vias, such as through vias, and dielectric layers, such as low-k dielectric layers, in one or more of the substrates in the bonded and/or stacked structure. For example, cracking and delamination of through vias and low-k dielectric layers may be reduced. Hence, the stress buffer layers may increase reliability of a bonded and/or stacked structure.

An embodiment is a structure. The structure includes a first substrate, a second substrate, a first stress buffer layer, a post-passivation interconnect (PPI) structure, and a second buffer layer. The first substrate includes a first semiconductor substrate and a first interconnect structure on the first semiconductor substrate. The second substrate includes a second semiconductor substrate and a second interconnect structure on a first side of the second semiconductor substrate. The first substrate is bonded to the second substrate at a bonding interface. The first interconnect structure and the second interconnect structure are disposed between the first semiconductor substrate and the second semiconductor substrate. A via extends at least through the second semiconductor substrate into the second interconnect structure. The first stress buffer layer is on a second side of the second semiconductor substrate. The second side of the second semiconductor substrate is opposite from the first side of the second semiconductor substrate. The PPI structure is on the first stress buffer layer and is electrically coupled to the via. The second stress buffer layer is on the PPI structure and the first stress buffer layer.

Another embodiment is a structure. The structure comprises a bonded structure, a stress buffer structure, and an external connector. The bonded structure comprises a first substrate and a second substrate bonded together at a bonding interface. The first substrate comprises a first metallization pattern in a first dielectric layer, and the second substrate comprises a semiconductor substrate and a second metallization pattern in a second dielectric layer on the semiconductor substrate. The bonded structure further comprises a via extending through the semiconductor substrate. The stress buffer structure is on the semiconductor substrate. The stress buffer structure comprises a first stress buffer layer and a redistribution element, and the first stress buffer layer is disposed between the semiconductor substrate and the redistribution element. The redistribution element is electrically coupled to the via. The external connector is electrically coupled to the redistribution element.

A further embodiment is a method. The method comprises bonding a first substrate to a second substrate. The second substrate comprises a semiconductor substrate. The method further comprises forming a via from a side of the semiconductor substrate and at least extending through the semiconductor substrate; forming a first stress buffer layer on the side of the semiconductor substrate; forming a post-passivation interconnect (PPI) structure on the first stress buffer layer and electrically coupled to the via; and forming a second stress buffer layer on the PPI structure and the first stress buffer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a first substrate comprising a first semiconductor substrate and a first interconnect structure on the first semiconductor substrate;
   a second substrate comprising a second semiconductor substrate and a second interconnect structure on a first side of the second semiconductor substrate, the first substrate being bonded to the second substrate at a bonding interface, the first interconnect structure and the second interconnect structure being disposed between the first semiconductor substrate and the second semiconductor substrate;
   a via extending at least through the second semiconductor substrate into the second interconnect structure;
   a first stress buffer layer on a second side of the second semiconductor substrate, the second side of the second semiconductor substrate being opposite from the first side of the second semiconductor substrate;
   a post-passivation interconnect (PPI) structure on the first stress buffer layer and electrically coupled to the via;
   a second stress buffer layer on the PPI structure and the first stress buffer layer, wherein a first portion of the second stress buffer layer and a second portion of the second stress buffer layer extend through a first region of the PPI structure to contact the first stress buffer layer, wherein the first portion and the second portion of the second stress buffer layer are separated and surrounded by the first region of the PPI structure, wherein the first region of the PPI structure is a continuous layer of electrically conductive material, wherein the second stress buffer layer contacts a sidewall and a top surface of the first region of the PPI structure;
   an under-bump structure on the first region of the PPI structure, the second stress buffer layer having a continuous material composition from the first stress buffer layer to the under-bump structure; and
   a bump contact on the under-bump structure.

2. The structure of claim 1, wherein the via extends beyond the bonding interface and into the first interconnect structure.

3. The structure of claim 1, wherein the via does not extend beyond the bonding interface.

4. The structure of claim 1, wherein the bonding interface consists essentially of dielectric-to-dielectric bonding.

5. The structure of claim 1, wherein the bonding interface comprises metal-to-metal bonding.

6. The structure of claim 1 further comprising:
   a conductive pad on the second side of the second semiconductor substrate opposite from the first side of the second semiconductor substrate, the conductive pad being electrically coupled to the second interconnect structure and the via, the PPI structure being over and electrically coupled to the conductive pad.

7. The structure of claim 1, wherein each of the first stress buffer layer and the second stress buffer layer has a Young's modulus in a range from 2 GPa to 4 GPa and a tensile strength in a range from 90 MPa to 200 MPa.

8. A structure comprising:
   a bonded structure comprising a first substrate and a second substrate bonded together at a bonding interface, the first substrate comprising a first metallization pattern in a first dielectric layer, the second substrate comprising a semiconductor substrate and a second metallization pattern in a second dielectric layer on the semiconductor substrate, the bonded structure further comprising a via extending through the semiconductor substrate;
   a stress buffer structure on the semiconductor substrate, the stress buffer structure comprising a first stress buffer layer, a redistribution element, and a second stress buffer layer, the first stress buffer layer being disposed between the semiconductor substrate and the redistribution element, the redistribution element being electrically coupled to the via, the redistribution element being disposed between the first stress buffer layer and the second stress buffer layer, the second stress buffer layer contacting a sidewall and a top surface of the redistribution element, the second stress buffer layer contacting the first stress buffer layer, the second stress buffer layer being a single layer; and an external connector directly over and electrically coupled to a first area of the redistribution element, the second stress buffer layer comprising a first downward extending portion and a second downward extending portion that extend through the first area of the redistribution element and contact the first stress buffer layer, wherein the first downward extending portion and the second downward extending portion are separate from each other and are surrounded by the first area of the redistribution element, wherein the first area of the redistribution element is a continuous metal layer.

9. The structure of claim 8, wherein the via extends to a portion of the second metallization pattern of the second substrate and does not extend beyond the bonding interface.

10. The structure of claim 8, wherein the via extends to a portion of the first metallization pattern of the second substrate.

11. The structure of claim 8, wherein a first surface of the first substrate at the bonding interface consists essentially of a first dielectric material, and a second surface of the second substrate at the bonding interface consists essentially of a second dielectric material, the first surface being directly bonded to the second surface.

12. The structure of claim 8, wherein a first portion of the first metallization pattern is at the bonding interface, and a second portion of the second metallization pattern is at the bonding interface, the first portion of the first metallization pattern being directly bonded to the second portion of the second metallization pattern.

13. The structure of claim 8, wherein the external connector extends through the second stress buffer layer to the redistribution element.

14. The structure of claim 13, wherein the external connector comprises:
an under-bump structure contacting the redistribution element and on a surface of the second stress buffer layer distal from the first stress buffer layer, the under-bump structure extending through the second stress buffer layer; and
a conductive bump on the under-bump structure.

15. The structure of claim 8, wherein each of the first stress buffer layer and the second stress buffer layer is capable of elongation at least 30% before rupture.

16. A device comprising:
a first substrate comprising a first bulk substrate and a first interconnect structure on the first bulk substrate;
a second substrate comprising a second bulk substrate and a second interconnect structure on a first side of the second bulk substrate, the first substrate being bonded to the second substrate, the first interconnect structure and the second interconnect structure being disposed between the first bulk substrate and the second bulk substrate;
a conductive pad over a second side of the second bulk substrate, the second side of the second bulk substrate being opposite from the first side of the second bulk substrate;
a passivation layer over the conductive pad and the second substrate;
a first stress buffer layer over the passivation layer and the conductive pad, the first stress buffer layer being a polymer layer;
a conductive interconnect over the first stress buffer layer and electrically coupled to the conductive pad; and
a second stress buffer layer over the conductive interconnect and the first stress buffer layer, a plurality of first portions of the second stress buffer layer extending through a first region of the conductive interconnect to contact the first stress buffer layer, each of the plurality of first portions of the second stress buffer layer being laterally surrounded by the first region of the conductive interconnect, each of the plurality of first portions of the second stress buffer layer being separated from each other by the first region of the conductive interconnect, the second stress buffer layer being a polymer layer, the first region of the conductive interconnect being a continuous layer of electrically conductive material.

17. The device of claim 16 further comprising:
a conductive connector over and electrically coupled to the first region of the conductive interconnect, the conductive connector contacting the plurality of first portions of the second stress buffer layer.

18. The device of claim 16 further comprising:
a via extending through the second bulk substrate and the second interconnect structure into the first interconnect structure.

19. The device of claim 16, wherein the second stress buffer layer contacts a sidewall and a top surface of the first region of the conductive interconnect, the second stress buffer layer contacting the first stress buffer layer, the second stress buffer layer being a single layer.

20. The device of claim 17, wherein the conductive connector comprises:
an under-bump structure that physically contacts the plurality of first portions of the second stress buffer layer; and
a conductive bump on the under-bump structure.

* * * * *

UNITED STATES PATENT AND TRADEMARK OFFICE
CERTIFICATE OF CORRECTION

PATENT NO.        : 10,510,723 B2                                    Page 1 of 1
APPLICATION NO.   : 15/784965
DATED             : December 17, 2019
INVENTOR(S)       : Chen-Fa Lu It is certified that error appears in the above-identified patent and that said Letters Patent is hereby corrected as shown below:

In the Claims

In Column 15, Lines 24-25, Claim 10, delete "the second substrate" and insert --the first substrate--.

Signed and Sealed this
Seventh Day of April, 2020

Andrei Iancu
*Director of the United States Patent and Trademark Office*